United States Patent
Stangl et al.

(10) Patent No.: US 8,101,852 B2
(45) Date of Patent: Jan. 24, 2012

(54) SINGLE-SIDED CONTACT SOLAR CELL WITH PLATED-THROUGH HOLES AND METHOD FOR ITS PRODUCTION

(75) Inventors: Rolf Stangl, Berlin (DE); Stefan Gall, Berlin (DE)

(73) Assignee: Helmhotz-Zentrum Berlin Fuer Materialien und Energie GmbH, Berlin (DE)

( * ) Notice: Subject to any disclaimer, the term of this patent is extended or adjusted under 35 U.S.C. 154(b) by 439 days.

(21) Appl. No.: 12/304,219

(22) PCT Filed: Jun. 2, 2007

(86) PCT No.: PCT/DE2007/001007
§ 371 (c)(1),
(2), (4) Date: Dec. 10, 2008

(87) PCT Pub. No.: WO2007/140763
PCT Pub. Date: Dec. 13, 2007

(65) Prior Publication Data
US 2009/0266401 A1 Oct. 29, 2009

(30) Foreign Application Priority Data
Jun. 10, 2006 (DE) .......................... 10 2006 027 737

(51) Int. Cl.
*H01L 31/00* (2006.01)
(52) U.S. Cl. ........................................ 136/256
(58) Field of Classification Search .................. 136/244, 136/256
See application file for complete search history.

(56) References Cited

U.S. PATENT DOCUMENTS 3,903,427 A * 9/1975 Pack .......................... 250/208.2
(Continued)

FOREIGN PATENT DOCUMENTS
DE 19854269 6/2000
(Continued)

OTHER PUBLICATIONS

Emmanuel Van Kerschaver et al. "Back-contact Solar Cells: A Review", Progress in Photovoltaics: Research and Applications, Res. Aplll., May 25, 2005, published online in Wiley InterScience (www.interscience.wiley.com). DOI: 10.1002/pip,657 (17 pages).
(Continued)

*Primary Examiner* — Jennifer Michener
*Assistant Examiner* — Eli Mekhlin
(74) *Attorney, Agent, or Firm* — Leydig, Voit & Mayer, Ltd.

(57) ABSTRACT

In an embodiment of the present invention, a single-sided contact solar cell includes an absorber layer with plated-through holes; an emitter layer disposed on a first side of the absorber layer, the emitter layer including one or more semiconductor materials having different dopants; a field passivation layer disposed on a second side of the absorber layer; a contact grid covered on a top surface thereof with an insulation layer and electrically connected to a first end of the plated-through holes; and a contact layer. The contact grid and contact layer are disposed together on one side of the absorber layer and insulated with respect to each other and electrically contacted from outside of the solar cell. The contact grid is disposed between the absorber layer and the emitter layer or the field passivation layer, and the contact layer is disposed on the emitter layer or on the field passivation layer so that both the contact grid and contact layer are disposed on a top surface of the solar cell. The emitter layer or the field passivation layer is electrically connected to a second end of the plated-through holes. Where the second end of the plated-through holes is electrically connected to the emitter layer, the absorber layer and the contact grid are electrically insulated from each other.

16 Claims, 13 Drawing Sheets

U.S. PATENT DOCUMENTS

| | | |
|---|---|---|
| 5,468,652 A | 11/1995 | Gee |
| 5,641,362 A | 6/1997 | Meier |
| 6,559,479 B1 | 5/2003 | Ludemann et al. |
| 2004/0055894 A1* | 3/2004 | Iwasaki et al. ............... 205/157 |
| 2004/0261834 A1 | 12/2004 | Basore et al. |
| 2005/0172996 A1 | 8/2005 | Hacke et al. |
| 2006/0130891 A1* | 6/2006 | Carlson ......................... 136/256 |

FOREIGN PATENT DOCUMENTS

| | | |
|---|---|---|
| DE | 69631815 | 2/2005 |
| DE | 102005025125 | 12/2006 |
| EP | 1460693 | 9/2004 |
| JP | 11177109 A * | 7/1999 |
| WO | 03019674 | 3/2003 |
| WO | 2006029250 | 3/2006 |

OTHER PUBLICATIONS

Peter Engelhart et al. "The Rise-EWT Solar Cell—A New Approach Towards Simple High Efficiency Silicon Solar Cells", 15th International Photovoltaic Science and Engineering Conference, Shanghai, China, 2005, pp. 802-803.

* cited by examiner

SINGLE-SIDED CONTACT SOLAR CELL WITH PLATED-THROUGH HOLES AND METHOD FOR ITS PRODUCTION

CROSS REFERENCE TO RELATED APPLICATION

This is a U.S. National Phase application under 35 U.S.C. §371 of International Application No. PCT/DE2007/001007, filed on Jun. 2, 2007, and claims the benefit of German Patent Application No. 10 2006 027 737.6, filed on Jun. 10, 2006. The International Application was published in German on Dec. 13, 2007 as WO 2007/140763 A2 under PCT Article 221(2).

FIELD

The invention relates to single-sided contact solar cells comprising at least one absorber layer structured with plated-through holes and one emitter layer that is disposed on one side of the absorber layer and that is made of semiconductor materials having different dopants.

BACKGROUND

Solar cells are components that convert light into electric energy. Normally, they are made of semiconductor materials comprising regions or layers having a different conductivity for positive and negative charge carriers, n-type or p-type conductive regions. The regions are referred to as emitters and absorbers. Positive and negative excess charge carriers created by incident light are separated at the p-n junction between the emitter layer and the absorber layer, and they can be collected and dissipated by contact systems that are electrically conductively connected to the appertaining regions. Accordingly, the only excess charge carriers that contribute to the useable electric output of solar cells are those that reach the contact systems and do not recombine with a charge carrier of the opposite polarity prior to that.

Single-sided contact solar cells have both contact systems in order to separately collect the excess charge carriers from the absorber layer on one and the same side. First of all, this has the fundamental advantage that only one side has to be processed for contact purposes. As set forth in the present invention, the term "front contact" is used when both contact systems are located on the side (front) of the solar cell that is exposed to incident light during operation. In contrast, the term "back contact" is used when both contact systems are located on the side (back) of the solar cell that is not exposed to incident light during operation. Moreover, the term "top" is used in conjunction with the solar cell. This refers to the side of the solar cell that is accessible during operation and especially also during its production. In the case of an absorber wafer, both sides of the solar cell are accessible and thus referred to as tops. In the case of thin-layer-based solar cells with a substrate or superstrate, the side of the solar cell opposite from the substrate or superstrate is referred to as the "top". With a substrate, this is the front, whereas with a superstrate, this is the back.

An important aspect in the arrangement of the contact systems is primarily their efficiency during the collection of charge carriers. If the absorber layer of the solar cell is of sufficiently good electronic quality, that is to say, if the effective bulk-diffusion length of the minority charge carriers is substantially larger than the thickness of the absorber layer, then as a rule, the emitter layer can advantageously be located on the back of the solar cell. In the case of a back contact, this especially translates into the advantages that, first of all, no shading losses occur through a contact system, which leads to an improvement in the efficiency of the solar cell, and secondly, the side of the solar cell that is to be exposed to the incident light during operation can be simply covered with additional functional layers over its entire surface. This can be, for example, a front field passivation layer (Front Surface Field, FSF) for backscattering the minority charge carriers or else an additional anti-reflection layer. However, if the absorber layer is of relatively low electronic quality, that is to say, if the effective bulk-diffusion length of the minority charge carriers is smaller than or in the order of magnitude of the thickness of the absorber layer, then the emitter layer should advantageously be located on the front of the solar cell. All of the minority charge carriers of the absorber layer that are created at a depth that is less than the effective bulk-diffusion length of the absorber layer can then be reliably collected. In the case of front contact, for purposes of improving the efficiency of the backscattering of the minority charge carriers, a back field passivation layer (Back Surface Field, BSF) can be provided (analogously, in the case of a back contact, a front field passivation layer (Front Surface Field, FSF) can be provided).

A relevant aspect for solar cells according to the invention is single-sided back contacts according to the state of the art that also contact the front by means of plated-through holes through the appropriately structured absorber layer. These are so-called Metal-Wrap-Through (MWT) or Emitter-Wrap-Through (EWT) technologies in which a metallic rib that contacts the front emitter layer via a contact grid or the front emitter layer itself are plated-through through the absorber layer with a corresponding contact system on the back of the solar cell.

Single-sided front contact solar cells with plated-through holes have not yet been realized due to a lack of a technologically simple and efficient production method. Only one-sided back-contact solar cells with plated-through holes are known from the prior art. A good overview of back-contact solar cells with plated-through holes can be found in the publication by E. V. Kerschaver et al.: "Back-contact Solar Cells: A Review" (Prog. Photovolt: Res. Appl., May 25, 2005, published online in Wileys InterScience DOI: 10.1002/pip.657).

An emitter-wrap-through (EWT) technology for wafer-based solar cells is described in U.S. Pat. No. 5,468,652. This publication describes point-contacting in which holes that are laser-drilled through the emitter layer, which is located on the front of the absorber layer, and through the absorber layer are contacted with a contact system on the back of the wafer. The emitter layer—as well as an optional BSF layer—are created by means of diffusion. Here, the other contact system for dissipating the minority charge carriers is insulated with respect to the back of the wafer and interdigitated with a contact system for dissipating the minority charge carriers that is not insulated with respect to the back of the wafer. In particular, a structuring separation of the emitter layer and absorber layer or BSF layer on the back, including the two interdigitated contact systems, is needed. This is done by selective removal of an insulating oxide layer and by selective diffusion.

An alternative emitter-wrap-through technology for wafer-based solar cells is known as a RISE-EWT solar cell (see publication by P. Engelhardt et al.: "The RISE-EWT Solar Cell—A New Approach Towards Simple—High Efficiency Silicon Solar Cells", 15$^{th}$ International Photovoltaic Science and Engineering Conference, Shanghai, China, 2005, p. 802-803). The structuring separation of the emitter layer and absorber layer or BSF layer on the back, including the two interdigitated contact systems on the back of the wafer, is carried out here by means of laser structuring (creation of comb-like depressions) so that a metal can be deposited over the entire back surface, thereby forming the two contact systems.

Furthermore, DE 696 31 815 T2 describes a wafer-based back-contact crystalline homo-solar cell without plated-through holes in which a contact grid surrounded by an insulation layer is provided above which a contact layer is arranged over the entire surface, with an interposed insulation layer. With this homo-contact solar cell, however, the emitter layer is structured by counter-doping the absorber layer with dopants from the contact grid. Therefore, the emitter layer is not configured as an autonomous functional layer but rather is made up of integrated small regions in the absorber layer directly underneath the contact grid. Owing to the complex diffusion processes, a sharp p-n junction cannot be made. The insulation layer on the metal grid can be formed by a selective oxide, for example, aluminum oxide.

DE 198 54 269 A1 describes a thin-layer-based hetero-solar cell with a substrate and with plated-through holes in which one contact system is configured as a contact grid, but it is integrated directly into the back of the absorber layer in front of an electrically conductive substrate. The other contact system is configured as a full-surface contact layer and is arranged on the back of the electrically conductive substrate (FIG. 6). Consequently, the electrical conductivity of the substrate is essential for the function. The contact grid between the absorber layer and the substrate is completely sheathed by an insulation layer in order to avoid a direct and indirect electrically conductive connection of the absorber layer to the contact grid. The electrically conductive connection of the contact grid exclusively to the emitter layer is the result of plated-through holes through the absorber layer in the form of passage openings through the full-surface emitter layers and absorber layers. The passage openings are partially filled with emitter material and partially with contact grid material, which is why they are difficult to realize technologically. FIG. 3 shows an embodiment with two interdigitating contact systems that—embedded in an insulation layer—are applied directly onto the substrate. For contacting purposes, two different point contacts are needed. Towards this end, holes are made through the emitter layer, the absorber layer and the insulation layer that, in the case of point-contacting of the emitter layer have to be created in two stages and have to be lined with emitter material; in the case of point-contacting of the absorber layer, only the lower region of the holes is selectively filled with metal. As an alternative, the contact system that is provided for contacting the absorber layer can be deposited onto the substrate without insulation. It is then contacted directly at the time of the deposition of the absorber layer. This saves the step of point-contacting of the absorber layer, but instead, the contact layers on the substrate have to be appropriately structured so as to be insulating/non-insulating. However, in all of the embodiments, both contact systems are located on the bottom of the solar cell (the side closest to the substrate) underneath the active solar cell layers, as a result of which they are commensurately difficult to produce and to contact.

A thin-layer-based superstrate solar cell in an $n^{++}$ip-doped configuration having a back contact with two contacting types for the $n^{++}$-layer and the p-layer is described in WO 03/019674 A1. The intrinsically doped i-layer can be considered here as the absorber layer and the $n^{++}$-layer or p-doped layer can be considered as the emitter layer or BSF layer. Here, both contact systems are on the top of the solar cell (the side furthest away from the superstrate, which is, at the same time, the back of the solar cell) above the active solar cell layers (consisting of an emitter layer, an absorber layer and a field passivation layer), and these contact systems are plated-through by point contacts through an insulation layer to the p-layer, or through the insulation layer, the p-layer and the i-layer to the $n^{++}$-layer. In the case of the p-layer, the point contacts are metallic, and in the case of the $n^{++}$-layer, the holes have to be lined with an emitter material (an n-layer). The different point contacts are now combined by means of contact strips on the top of the solar cell to form the two structured contact systems. In particular, the possibility also exists of an integrated series connection and parallel connection of a finished solar cell module.

SUMMARY

It is an aspect of the present invention to provide a single-sided contact solar cell with plated-through holes that can be produced in a relatively technologically simple manner.

In an embodiment, the present invention provides a single-sided contact solar cell including an absorber layer with plated-through holes; an emitter layer disposed on a first side of the absorber layer, the emitter layer including one or more semiconductor materials having different dopants; a field passivation layer disposed on a second side of the absorber layer; a contact grid covered on a top surface thereof with an insulation layer and electrically connected to a first end of the plated-through holes; and a contact layer. The contact grid and contact layer are disposed together on one side of the absorber layer and insulated with respect to each other and electrically contacted from outside of the solar cell. The contact grid is disposed between the absorber layer and the emitter layer or the field passivation layer, and the contact layer is disposed on the emitter layer or on the field passivation layer so that both the contact grid and contact layer are disposed on a top surface of the solar cell. The emitter layer or the field passivation layer is electrically connected to a second end of the plated-through holes. Where the second end of the plated-through holes is electrically connected to the emitter layer, the absorber layer and the contact grid are electrically insulated from each other.

BRIEF DESCRIPTION OF THE DRAWINGS

In the following detailed description, various embodiments of a contact solar cell according to the invention are explained in greater detail, making reference to embodiments illustrated in the attached drawings, which are not drawn to scale.

FIGS. 2A and 2B depict sectional views of an embodiment of a solar cell HKS with a wafer-based absorber layer AS, with a field passivation layer FSF plated-through to the contact grid KG through the absorber layer AS, and with an emitter layer ES located on the back of the absorber layer AS.

DETAILED DESCRIPTION

Figure 1A:
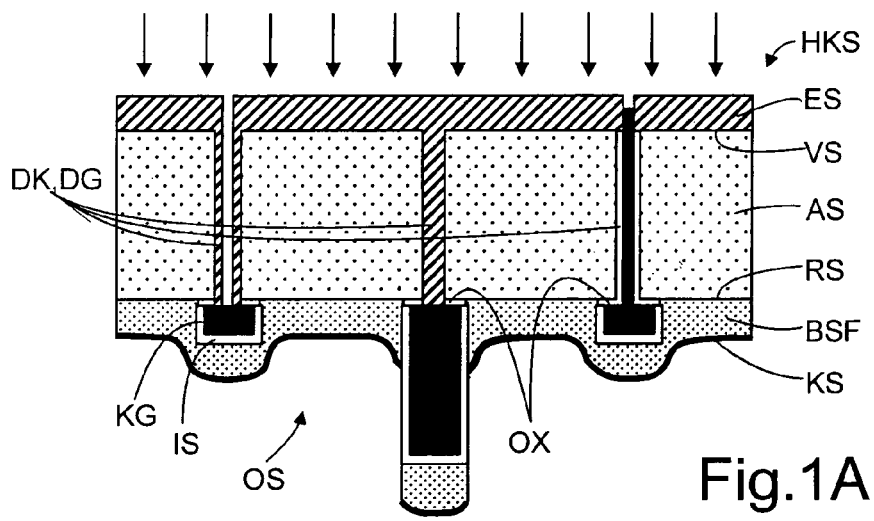
FIGS. 1A-1D depict sectional and top views of an embodiment of a hetero-contact solar cell HKS.

The invention relates to a single-sided contact solar cell comprising at least one absorber layer structured with plated-through holes and one emitter layer that is arranged on one side of the absorber layer over the entire surface and that is made of semiconductor materials having different dopants, whereby excess charge carriers are created in the absorber layer by incident light, they are then separated at the p-n junction between the absorber layer and the emitter layer, and collected and dissipated through two contact systems that are arranged together on one side of the absorber layer and that are electrically contacted from the outside and insulated with respect to each other, whereby one of the contact systems is arranged on the absorber layer and is configured as a contact grid that, at least on its entire top, is covered with an insulation layer and is electrically conductively connected to the plated-through holes at one of their ends, while the other contact system is configured as a full-surface contact layer. Moreover, in another embodiment, the invention relates to a method for the production of such solar cells. The absorber layers can be configured as self-supporting wafers or as a thin layer on a substrate or superstrate.

In an embodiment, the invention provides a single-sided contact solar cell with plated-through holes that can be produced in a technologically simple manner for wafer-based solar cells as well as for thin-layer solar cells having a substrate or superstrate configuration. In the case of a wafer-based solar cell, this means that, except for the simple creation of holes in the wafer, no additional structuring measures should be required. In the case of thin-layer solar cells, this means that only one type of point-contacting should still be needed. Thus, the set-up and the production of the contact systems are greatly simplified. For wafer-based solar cells as well as for thin-layer-based solar cells, the active solar cell layers as well as the second contact layer are deposited over the entire surface. Solar cells with a high level of efficiency may be created by providing field passivation layers. Moreover, front contacts as well as plated-through holes of field passivation layers may be put forward. Methods for the production of such solar cells can be efficient, cost-effective and readily adaptable in terms of their configuration possibilities.

An embodiment of the invention has two electrically conductive, functional solar cell layers located opposite from each other, namely, the emitter layer and a field passivation layer, which are located separately on the front and back of the absorber layer, whereby one of the two functional solar cell layers is plated-through through the absorber layer. The plated-through sites are connected to each other so as to be electrically conductive by means of a metallic contact grid and are electrically insulated on the surface of the contact grid. The contact grid, which is insulated towards the outside, is then located between the absorber layer and a functional solar cell layer that is deposited over the entire surface. This functional solar cell layer (which was not plated-through) is contacted with a contact layer over the entire surface. Therefore, complex structuring or insulation of the contact systems on both sides can be eliminated altogether. Moreover, both functional solar cell layers, namely, the emitter layer and the field passivation layer, are unstructured, as a result of which the manufacturing effort may be reduced even further and the efficiency can be increased even further. In an embodiment, the structuring of the absorber layer is limited to the creation of plated-through holes that are geometrically extremely simple, and there is no need for an integrating structuring of the contact grid. By the same token, complex region structuring of the emitter layer or of the field passivation layer of the solar cell does not occur. Both contact systems are separated from each other by means of an insulation layer and another functional solar cell layer (emitter layer or field passivation layer), but they are on the top of the solar cell, which is more readily accessible for the manufacture (in the case of a thin-layer-based solar cell, the side opposite from the substrate or superstrate). Various embodiments of the invention are based on a self-supporting wafer-based solar cell or a thin-layer solar cell in an alternative substrate or superstrate configuration and in an alternative plating-through of the emitter layer or field passivation layer with an emitter layer arranged on the front or back (relative to the incident light).

In one embodiment of the invention, emitter-wrap-through technologies can be used to achieve a back contact in the case of the emitter layer that is arranged on the front. If a field passivation layer is plated-through (FSF-wrap-through or BSF-wrap-through), the ohmic losses of the majority charge carriers, which now no longer flow to the contact grid through the absorber layer but rather through the FSF layer, can be minimized, provided that the plated-through field passivation layer is more conductive than the absorber layer. Particularly for thin-layer-based solar cells that are deposited onto a substrate or superstrate, a front contact can also be advantageous, for example, if the absorber boundary surface can be best passivated with the most recently deposited functional solar cell layer (emitter layer or field passivation layer). The full-surface contact layer that contacts the emitter layer or the field passivation layer may be configured so as to be transparent. In the case of a thin-layer-based solar cell, both contact systems are on the top, that is to say, on the side of the solar cell that is readily accessible. In particular, the contacts are not buried and thus they are likewise readily accessible, facilitating a later series connection or parallel connection using simple structuring steps. In the case of wafer-based solar cells, both sides of the absorber layer are fundamentally easy to access and can serve as the top for the arrangement of the two contact systems.

A plating-through of field passivation layers (FSF-wrap-through or BSF-wrap-through) or of both contact systems on the front of the solar cell is not known in the art. Moreover, the prior-art plated-through holes differ fundamentally from the present invention in that both contact systems are always located "outside" of the active solar cell layers (consisting of the emitter layer, the absorber layer and the field passivation layer), whereas when in the invention, the contact grid is located "inside" of the solar cell layers, that is to say, either between the absorber layer and the emitter layer or between the absorber layer and a field passivation layer. Moreover, both contact systems are located on the technologically readily accessible top of the solar cell. As set forth in one embodiment of the invention, especially in the case of a plating-through of thin-layer-based solar cells, only one contacting type is needed (plating-through of the solar cell layer that is located on the bottom, that is to say, on the side of the absorber layer closest to the substrate/superstrate), rather than two contacting types (plating-through of the emitter layer and contacting of the absorber layer or the field passivation layer). In an embodiment of a wafer-based solar cell, there is no longer a need for any more complex structuring of the absorber layer or of the contact systems, since the second contact system (the contact layer) can be deposited over the entire surface. With the exception of the simple creation of holes in the wafer, no other structuring measures are needed and all of the active solar cell layers can be deposited over the entire surface.

(A) Back-Contact, Wafer-Based Solar Cells

A solar cell in which the emitter layer is on the back can have high levels of efficiency if the bulk-diffusion length of the minority charge carriers of the wafer is substantially larger than the wafer thickness. Then, a wafer having very high electronic quality (FZ wafer) is needed. In the case of wafers having a moderate electronic quality (CZ, poly-cSi, EFG wafers), the emitter layer should be placed on the front. However, the back-contacting according to the invention can be used, in which the emitter layer is punctually or partially wrapped through passage openings (holes or slits) in the wafer to the back of the solar cell ("emitter-wrap-through" concept). The passage openings in the wafer then become part of the emitter layer that is applied onto the front of the hetero-solar cell subsequent to the structuring of the wafer. When the plated-through holes of the emitter layer are connected through a contact grid, a short circuit of the absorber layer having the contact grid must be prevented. The passage openings may be adapted to the geometric shape of the contact grid, that is to say they are slit-shaped in the case of contact fingers, or an electrically insulating layer (for example, an oxide layer) may be provided on the absorber layer between point-shaped plated-through holes.

If the emitter layer that is configured as a thin-layer is left on the back of the solar cell, then, in an analogous manner, the front field passivation layer—if it is configured as a conductive front field passivation layer FSF (e.g. a-Si:H)—can lead punctually/partially to the back of the solar cell through plated-through holes in the absorber layer. The "FSF-wrap-through" concept, which is being newly defined here, roughly corresponds to the known "metal-wrap-through" concept for back-contact solar cells, whereby instead of the metal, a front field passivation layer FSF is plated-through through the absorber layer. In this manner, ohmic losses of the majority charge carriers, which now no longer flow to the contact grid through the wafer as the absorber layer but rather through the front field passivation layer, can be minimized, provided that the plated-through front field passivation layer is more conductive than the wafer itself. The series resistance and thus the filling factor of such a back-contact solar cell with a back emitter layer can be improved by this measure.

In one embodiment of the invention, both contact systems can be located on the back of the wafer without there being a need for a technologically complex structuring of the emitter layer or of the wafer. A production method according to this embodiment may include:

Creation of a full-surface electrically insulating protective layer on the back of the wafer The back of the wafer (during operation, the side of the solar cell facing away from the light) is provided with an electrically insulating protective layer. This layer protects the surface of the back of the wafer during the later structuring of the wafer and is removed again later. Moreover, in the case of emitter-wrap-through configurations, it serves as an insulation layer.

Structuring the wafer in order to create point-shaped, line-shaped, grid-shaped or lattice-shaped plated-through holes Holes or slits are created in the wafer (e.g. by laser structuring). Later, these serve as a point-shaped, line-shaped, grid-shaped or lattice-shaped plated-through hole for the functional layer that is created on the front (during operation, the side of the solar cell facing the light).

Full-surface texturing and passivation of the front of the wafer in order to reduce internal and external reflections Full-surface creation of the emitter layer or of a field passivation layer on the front of the wafer, incorporating the plated-through holes The wafer is either diffused conventionally or else a full-surface emitter layer or front field passivation layer configured as a thin-layer is deposited onto the front of the wafer, thus filling or encircling the holes/slits (e.g. a-Si:H). The holes/slits in the wafer thus become part of the functional layer that was applied onto the front of the solar cell.

Deposition of the one contact system in the form of a contact grid on the back of the wafer, covering the plated-through holes Subsequently, the metallic contact grid (e.g. Al) is applied onto the electrically insulating protective layer on the back of the wafer. Here, it should be ensured that the holes/slits are each located underneath the contact fingers of the contact grid. This can be done, for example, by screen printing or by metal deposition using shadow masks or photolithography. In this process, a metallic rib is placed onto the edge of the wafer. In the case of an emitter-wrap-through configuration, the contact grid serves to dissipate the excess minority charge carriers that were created in the wafer (absorber layer) and collected by the emitter layer. In the case of a FSF-wrap-through configuration, the contact grid serves to dissipate the excess majority charge carriers created in the wafer (absorber layer).

Creation of an electrical insulation layer that is on the entire free surface of the contact grid and that also prevents the charge carriers from tunneling through The contact grid is then surrounded by an insulation layer on its entire free surface. This can, in turn, be done in various ways: either by screen printing or by depositing an insulation layer using shadow masks or photolithography, or else by creating a thermal or electrochemical metal oxide layer on the surface of the contact grid.

Exposure of the back of the wafer without impairing the insulation layer on the contact grid Through selective etching (e.g. HF-dip), most of the back of the wafer that is not covered by the contact grid is now exposed/cleaned by removing the electrically insulating protective layer, but without the insulation layer of the contact grid being removed in the process.

Full-surface deposition of the emitter layer or of the field passivation layer—that was not created on the front of the wafer—on the back of the wafer with its concurrent passivation Then, on the entire back of the wafer, (except for a rib on the edge), the other functional layer (e.g. a-Si:H) is deposited over the entire surface. This covers the surface of the wafer as well as the surface of the contact grid and has to be capable of properly passivating the exposed surface of the wafer.

Full-surface deposition of the other contact system in the form of a contact layer on the deposited emitter layer or field passivation layer on the back of the wafer Subsequently, the surface of the other functional layer (except for the rib at the edge) is metallically contacted (e.g. Al) over the entire surface. In the case of an emitter-wrap-through configuration, the metallic contact layer serves to dissipate the excess majority charge carriers created in the wafer (absorber layer); in the case of a front surface field-wrap-through configuration, the metallic contact layer serves to dissipate the excess minority charge carriers that are created in the wafer (absorber layer) and collected by the emitter layer.

Electric contacting of the contact grid and of the contact layer

By electrically contacting the rib (possibly after removing the insulation layer on the rib) as well as the contact layer, the hetero-solar cell is then ready for operation. The two contact systems (rib of the insulated metallic contact grid on c-Si and full-surface contact layer on a-Si:H) are located on the back of the hetero-solar cell and can be series-connected or parallel-connected to the back of the module in a technologically very simple manner. If the rib of the contact grid is placed on the edge of a square c-Si wafer, then the rib of the contact grid as well as the contact layer can be very simply series-connected or parallel-connected by means of direct contacting (e.g. by means of a conductive adhesive copper strip).

(B) Thin-Layer-Based Hetero-Solar Cells, Substrate and Superstrate Configuration Analogous concepts can also be applied to thin-layer-based hetero-solar cells. With these, the two current-dissipating contact systems are located on the top of the solar cell in order to simplify the processing. This corresponds to a front contact in the substrate configuration and to a back contact in the superstrate configuration. However, the substrate or superstrate are not incorporated into the electric contacting. Therefore, it does not have to be electrically conductive and can be made of simple glass.

In thin-layer technology, all of the layers are deposited sequentially, starting from the substrate or superstrate; this is referred to below as being located underneath, irrespective of whether it is used later as a substrate or superstrate. Consequently, terms such as top/bottom of a layer refer to the side located closer/further to/from the substrate or superstrate, whereas terms such as front/back of a layer refer to the incident light.

Since a thin absorber layer can only be deposited with quite a few defects, the thickness of the absorber layer is selected in such a way that it is in the order of magnitude of the bulk diffusion length of the minority charge carriers of the absorber layer. Then, all of minority charge carriers created in the absorber layer can still just be collected. Then the emitter layer is on the front of the absorber layer since that is where more minority charge carriers are created that are then dissipated more quickly by the p-n junction formed there.

Therefore, in the substrate configuration as well as in the superstrate configuration, the thin emitter layer is located on the front of the thin absorber layer, whereas a highly conductive thin field passivation layer can be present on its back. Since, within the scope of thin-layer technology, all of the functional layers of the solar cell are deposited sequentially onto the substrate/superstrate, in the substrate configuration, first the back field passivation layer (BSF) is deposited, then the absorber layer and subsequently the emitter layer. In the superstrate configuration, first the emitter layer is deposited, then the absorber layer and subsequently the back field passivation layer (BSF). The functional solar cell layer that is located underneath the absorber layer is now plated-through by the latter, so that both contact systems can be arranged on the front of the hetero-solar cell. The functional layer that is to be plated-through is the back field passivation layer (BSF) in the case of the substrate configuration (BSF-wrap-through) or it is the emitter layer in the case of a superstrate configuration (emitter-wrap-through).

For example, a thin-layer-based hetero-solar cell, with a front emitter layer in the substrate configuration, may consist of a high-doped poly-c-Si layer created by metal-induced crystallization as the back field passivation layer, which, at the same time, serves as the seed layer for the thin absorber layer. It may also consist of a poly-c-Si absorber layer that has the same type of doping in a weaker doping and that was epitactically deposited from the gas phase, and it consists of an a-Si:H emitter layer that has the opposite doping and that was amorphously deposited from the gas phase. Analogously, for example, a thin-layer-based hetero-solar cell with a front emitter layer in a superstrate configuration may consist of a high-doped poly-c-Si layer created by metal-induced crystallization as the emitter layer, which, at the same time, serves as the seed layer for the absorber layer. It may also consist of a poly-c-Si absorber layer that has the opposite doping and that was epitactically deposited from the gas phase. It may also consist of an a-Si:H back field passivation layer that has the same type of doping as the absorber layer and that was amorphously deposited from the gas phase.

In principle, the emitter layer can also be arranged on the back of the solar cell. However, this arrangement only makes sense if the thickness of the absorber layer can be selected to be so thin that it is considerably less than the bulk diffusion length of the minority charge carriers in the absorber layer. Only then is it ensured that the minority charge carriers, which are mainly created in the front absorber layer, actually reach the emitter layer without appreciable recombination losses. Along with the concurrent requirement for an adequately high absorptivity on the part of the absorber layer, this also calls for the deposition of a very low-defect absorber layer. If this is the case, and if the boundary surface passivation of the field passivation layer is better than that of the emitter layer (which is often the case since it can be specially optimized for this purpose), then the arrangement of the emitter layer on the back is advantageous since the passivation of the front of the hetero-solar cell is more important than that of the back.

Since, within the scope of the thin-layer technology, all of the functional layers of the solar cell are deposited sequentially onto the substrate or superstrate, in the substrate configuration, first of all, the emitter layer, then the absorber layer and subsequently the front field passivation layer (FSF) are deposited, whereas in the superstrate configuration, first the front field passivation layer (FSF), then the absorber layer and subsequently the emitter layer are deposited. The functional solar cell layer that is located underneath the absorber layer is, in turn, plated-through through the latter so that both contact systems can be arranged on the top of the solar cell. Consequently, this is the emitter layer in the case of the substrate configuration (emitter-wrap-through) or the front field passivation layer (FSF) in the case of the superstrate configuration (FSF-wrap-through).

For example, a thin-layer-based hetero-solar cell with a back emitter layer in the substrate configuration may consist of a high-doped poly-c-Si layer created by metal-induced crystallization as the emitter layer, which, at the same time, serves as the seed layer for the thin absorber layer. It may also consist of a poly-c-Si absorber layer that has the opposite doping and that was epitactically deposited from the gas phase. It may also consist of an a-Si:H front field passivation layer (FSF) that has the same type of doping as the absorber layer and that was amorphously deposited from the gas phase. Analogously, for example, a thin-layer-based hetero-solar cell with a back emitter layer in the superstrate configuration may consist of a high-doped poly-c-Si layer created by metal-induced crystallization as the front field passivation layer (FSF), which, at the same time, serves as the seed layer for the thin absorber layer. It may also consist of a poly-c-Si absorber layer that has the same type of doping in a weaker doping and that was epitactically deposited from the gas phase. it may also consist of an a-Si:H emitter layer that has the opposite doping and that was amorphously deposited from the gas phase. The functional solar cell that is located underneath the absorber layer, and is thus closer to the substrate/superstrate, can now be plated-through through passage openings provided in the absorber layer on the front of the absorber layer that is further away from the substrate/superstrate. The charge carriers of the absorber layer that are collected by the appertaining functional layer are now collected on the front of the absorber layer through the metallic contact grid that is covered so as to be insulated. Here, it should be noted that the fingers of the contact grid each cover the passage openings in the absorber layer. The contact grid is integrated into the second functional solar cell layer (that can be deposited over the entire surface). Both contact systems are on the top of the solar cell. Here, the structuring of the absorber layer may be limited to simply creating passage openings (holes or slits). Both functional solar cell layers (emitter layer and field passivation layer) can be deposited over the entire surface. A production method according to this embodiment may include:

Application of the emitter layer or of a field passivation layer and of the absorber layer onto a substrate or superstrate A layer packet consisting of a first functional layer and of a thin absorber layer is applied onto a substrate/superstrate (e.g. glass) by means of thin-film technology. Depending on the desired configuration of the thin-layer-based solar cell, this is either the layer packet consisting of an emitter layer/absorber layer or the layer packet consisting of a field passivation layer/absorber layer (e.g. the layer packet consisting of a high-doped poly-c-Si seed layer on glass/a low-doped epitactically deposited poly-c-Si absorber layer). It could be the case that one or more functional layers are still needed as intermediate layers (between the substrate/superstrate and the first functional layer), which serve as buffer layers, reflection layers, seed layers or passivation layers, in order to increase the efficiency of the solar cell. For example, buffer layers having the smallest possible thickness can be used between the emitter layer and the absorber layer in order to more effectively passivate the boundary surface between the emitter and the absorber. In the case of doped amorphous silicon as the emitter material on a crystalline silicon wafer as the absorber layer, the buffer layer, for instance, as an ultrathin (approximately 5 nm) layer, can consist, for example, of intrinsic (undoped) amorphous silicon. However, buffer layers can also consist of a salt, for example, of cesium chloride. Then a corresponding surface dipole is established and the boundary surface recombination is likewise suppressed at the p-n junction. Moreover, if necessary, the surface of the absorber layer can be textured.

The thickness of the emitter layer is dimensioned in such a way that the charge carriers of the absorber layer can reach the back of the emitter layer facing away from the absorber layer. Moreover, the emitter layer can consist of such a material that an effectively passivating p-n junction to the absorber layer is established, whereby according to one embodiment it is necessary to adhere to a maximum boundary surface recombination rate of the charge carriers amounting to $10^5$ recombinations per $cm^2s$. Another embodiment provides a boundary surface recombination rate of, for example, $10^2$ recombinations per $cm^2s$.

Structuring the absorber layer with simple passage openings in order to create point-shaped, line-shaped, grid-shaped or lattice-shaped plated-through holes of the emitter layer or field passivation layer through the absorber layer Holes or slits are created in the absorber layer (e.g. by laser structuring or by selective etching). These serve later as a point-shaped, line-shaped, grid-shaped or lattice-shaped plated-through hole of the first functional layer, which was deposited underneath the absorber layer. In the case of an emitter-wrap-through configuration, first a full-surface insulation layer (e.g. a PECVD oxide deposited on the entire surface) has to be created on the surface of the absorber layer. This is optional in the case of a BSF-wrap-through configuration or FSF-wrap-through configuration.

As an alternative, in the case of a metallic plating-through in the BSF-wrap-through configuration or FSF-wrap-through configuration, the preceding structuring of the absorber layer can also be eliminated if a metallic contact grid or metallic point contacts (e.g. Al) are applied onto the surface of the absorber layer, for example by means of vapor deposition, and the thin-layer packet is subsequently tempered. As a result, the metal can be driven into the absorber layer due to a preferred spike formation (e.g. especially the system Al on Si), so that the metal is plated-through to the back or front field passivation layer. This process step can then likewise be carried out concurrently with the process step for the application of the contact grid on one side of the absorber layer.

Filling the passage openings with a functional layer material or an electrically conductive material The passage openings (holes/slits) created in the absorber layer are now filled either with a functional material that corresponds to the function of the second functional solar cell layer, or else with a conductive material. If a conductive material is used for the filling, in the case of an emitter-wrap-through configuration, this material is electrically insulated against the absorber layer, i.e. in this case, the passage openings first are coated on the inside with an insulating material and subsequently filled with a conductive material. This is optional in the case of a BSF-wrap-through configuration or FSF-wrap-through configuration. In the case of filling with a metallic material, this process step can also be carried out in parallel with the process step of the application of the contact grid in that a metallic paste is applied (for example, by means of screen printing) that then fills the passage openings.

Deposition of the one contact system in the form of a contact grid on the side of the absorber layer that is opposite from the emitter layer or field passivation layer Subsequently, the metallic contact grid (e.g. Al) is applied onto the top of the absorber layer. In the case of an emitter-wrap-through configuration, this has to be done on the electrically insulating protective layer that had previously been appropriately created on the side of the absorber layer facing the field passivation layer; this is optional in the case of a BSF-wrap-through configuration or FSF-wrap-through configuration. When the contact grid is applied, it should be ensured that the passage openings are located in the absorber layer underneath the fingers of the contact grid. In the case of an emitter-wrap-through configuration, the contact grid serves to dissipate the excess minority charge carriers that were created in the absorber layer and collected through the emitter layer. In the case of an FSF-wrap-through configuration, the contact grid serves to dissipate the excess majority charge carriers created in the absorber layer. If the contact grid is arranged on the front of the absorber layer, its contact surface to the absorber layer is dimensioned in such a way that it can optimally dissipate the current that is to be anticipated, but so that the shading surface area is nevertheless minimal. According to one embodiment, the total surface area of the contact grid is less than 5% of the absorber surface.

The contact grid—where the term "grid" also includes any finger-shaped or lattice-like or similar narrow-ribbed structure, also without intersections—can be applied in prefabricated form directly onto the absorber layer, for example, by means of a conductive adhesive. Moreover, the contact grid can be selectively applied directly onto the absorber layer by means of a simple screen print or, using an appropriate mask, by means of thermal vapor deposition of an electrically conductive material or by means of a metal deposition using shadow masks or photolithography. Ink-jet printing or photolithography can likewise be used.

Creating an electric insulation layer IS that also prevents the charge carriers from tunneling through, over the entire free surface of the contact grid (KG)

The contact grid is then sheathed with an insulation layer. This can, in turn, be done in a number of different ways: either by means of screen printing or by the deposition of an insulation layer using shadow masks or photolithography or by creating a thermal or electrochemical metal oxide layer on the surface of the contact grid. In one embodiment, this insulation layer has a minimum thickness that is at least such that charge carriers are reliably prevented from tunneling through.

In order to apply the insulation layer onto the entire free surface of the contact grid, for example, an insulating compound can be applied selectively using screen printing or ink-jet printing or a mask, especially a shadow mask, also by sputtering, gas phase deposition or photolithography. As an alternative, an electrically insulating protective layer can be applied thermally or wet-chemically or electrochemically onto the entire free surface of the contact grid and of the interposed free absorber layer. Due to the differently selected materials for the contact grid and the absorber layer, a different protective layer is also formed. In the case of a contact grid made, for example, of aluminum, the protective layer is correspondingly aluminum oxide, and in the case of an absorber layer made of silicon, the protective layer is thermal silicon oxide if oxygen tempering was employed. In the example of oxygen tempering, an approximately 20 nm-thick aluminum oxide layer can be expected on the entire free surface of the contact grid in the case of an aluminum contact grid on a silicon absorber layer, and an approximately 5 nm-thick silicon oxide layer can be expected on the absorber layer that is not covered by the contact grid. In the case of the thermal creation of the protective layer, this process can be carried out together with the tempering of the conductive material of the contact grid in the absorber layer in order to form a BSF in a temperature-controlled heating process.

Exposure of the side of the absorber layer that is opposite from the emitter layer or field passivation layer, without damaging the insulation layer on the contact grid Through selective etching/cleaning (e.g. HF-dip), most of the surface of the absorber layer that is not covered by the contact grid is exposed, but without the insulation layer of the contact grid being removed in the process. This corresponds to a removal of the electrically insulating protective layer (e.g. thermal oxide) in the case of an emitter layer plating-through or corresponds to a cleaning (=removal of the natural oxide) of the free surface of the absorber layer.

The selective etching of the protective layer (for example, an oxide layer) on the absorber layer can likewise be carried out without any problem since, the different oxides have different etching rates in the etching process. In particular, with an appropriately selected etching medium, a metal oxide is more etching-resistant than a silicon oxide. In the example involving the materials aluminum and silicon, which is then also used correspondingly for the emitter layer, the selective etching can be carried out by simply dipping it briefly into diluted hydrofluoric acid HF. In this process, the hydrofluoric acid not only selectively removes the silicon oxide, but at the same time, through the formation of Si—H bonds, ensures a good surface passivation of the absorber layer made of silicon. Consequently, the etching agent can be selected in such a way that, after the removal of the oxide on the absorber layer, the latter can be readily passivated on its exposed surface.

Full-surface deposition of the emitter layer or of the field passivation layer that have not yet been deposited on the side of the absorber layer having the contact grid, with concurrent passivation of the exposed regions of the absorber layer On the entire side of the absorber layer having the contact grid (except for a small region of the contact grid that is needed for the later contacting), the second functional solar cell layer (e.g. a-Si:H) is deposited over the entire surface. Depending on the desired solar cell configuration, this is then the emitter layer or the front or back field passivation layer (FSF, BSF). It then completely covers the free surface of the absorber layer and (completely or partially) covers the surface of the insulated contact grid. The deposited second functional layer has to be capable of properly passivating the exposed surface of the absorber layer (boundary surface).

Full-surface deposition of the other contact system in the form of a contact layer on the deposited emitter layer or field passivation layer on the side of the absorber layer having the contact grid Subsequently, the free side of the second deposited functional layer is metallically contacted over the entire surface (e.g. Al or TCO), so that a good ohmic contact is established. In the case of an emitter-wrap-through configuration, the metallic contact layer serves to dissipate the excess majority charge carriers created in the absorber layer and, in the case of an FSF-wrap-through configuration, it serves to dissipate the excess minority charge carriers that are collected through the emitter layer. Here, the contact layer can be configured over the entire surface or, by using the masking technique, over part of the surface, and can be applied in a simple manner, for example, by applying a metal contact or by vapor deposition.

Electrical contacting of the contact grid and of the contact layer

By electrically contacting of the regions of the contact grid left open (possibly after the removal of the insulation layer) as well as of the contact layer, the solar cell is then ready for operation. The two contact systems (contact grid and contact layer) are located on the front of the solar cell, i.e. on the side of the solar cell provided for the incident light during operation later on. The electrical contacting of the contact grid can be effectuated by laterally arranged ribs or by leaving a connection region on the contact grid open (for example, by means of a shadow mask) during the layer deposition and by exposing the connection region by removing the previously created insulation layer (for example, by means of mechanical scratching). The contact layer can be electrical contacted directly without any further measures, thanks to its direct accessibility. A module connection can be made in a simple manner as described below.

In thin-layer solar cell technology with a deposition capability on a large-surface substrate or superstrate, e.g. glass, an entire solar cell module may be manufactured all at once. After the deposition of the functional solar cell layers, individual regions (as a rule, strips) are created on the substrate or superstrate by means of structuring, which then function as individual solar cells and are correspondingly connected in series or in parallel. The thin-layer-based hetero-solar cell structure according to an embodiment of the invention allows a simple series connection or parallel connection of the individual solar cell regions, which can be achieved with just two structuring steps, whereby all of the solar cell layers can still be deposited over the entire surface. Further elaborations on this can be gleaned from the specific description part.

The method according to one embodiment of the invention is equally suitable for the creation of a one-sided front or back-contact of the solar cell. Here, the choice of the one-sided contact depends on the electronic quality of the absorber layer and on the desired substrate or superstrate configuration. If the absorber quality is good, then the emitter layer can be placed onto the back of the absorber layer. However, if the absorber quality is poor, then the emitter layer can be placed onto the front of the absorber layer. This corresponds to a front contact in the case of the substrate configuration and to a back contact in the case of the superstrate configuration. With a front contact, the contact layer is configured so as to be transparent, for example, in the form of a transparent conductive oxide layer, TCO. Then, in order to improve the charge carrier collection on the front of the absorber layer, current-collecting contact elements can still be provided on the front of the absorber layer. In order to minimize the shading losses, the contact elements and the contact grid are constructed congruently and positioned directly one above the other.

Absorber layers, emitter layers and field passivation layers may be made of silicon. Here, crystalline silicon, especially with n-type or p-type doping (n/p c-Si), can be used for the absorber layer, and amorphous, hydrogen-enriched silicon, correspondingly to n-type or p-type doping (p/n a-Si:H), can be used for the emitter layer. An optionally present buffer layer between the absorber layer and the emitter layer may likewise be made of amorphous silicon, albeit undoped. Such a material system ensures an especially well passivated p-n junction for purposes of charge separation. All of the contact systems and contact elements can be made of aluminum in the case of a back contact. In the case of a front contact, the contact layer has to be made of a transparent conductive material, for example, ZnO. The substrates and superstrates may be made of electrically non-conductive glass. The field passivation layer can consist of a polycrystalline silicon on the front of the absorber layer and of an amorphous, hydrogen-enriched silicon on the back. Emitter layer material or field passivation layer material, but also other electrically conductive material, for example, a polymer or a metal, can be used to create the plated-through holes. An oxide, for example, is suitable as the insulating material for the contact grid and the passage openings. SiN, for instance, can be used for a passivation layer that concurrently functions as a field passivation layer.

Examples

Wafer-Based Hetero-Solar Cell With Back Contact and Emitter Layer Plating-Through (Emitter-Wrap-Through Concept)

FIG. 1A shows a cross section of a solar cell HKS (here in this embodiment, a hetero-contact solar cell; by appropriately selecting the material of the absorber layer and of the emitter layer, however, a homo-contact solar cell concept can also be created analogously) with a wafer-based absorber layer AS (c-Si), an emitter layer ES (diffused or a-Si:H) on the front VS (during operation, the side facing the light, incident light indicated by parallel arrows) of the absorber layer AS and of a field passivation layer BSF (for example, a-Si:H). Moreover, the solar cell HKS has plated-through holes DK with point-shaped passage openings DG in three different embodiments (on the left, diffused/c-Si, in the middle, filled a-Si:H, on the right, insulated and metallically filled/Al). This is a schematic compilation of the various plated-through hole possibilities. In one embodiment, only one possibility is implemented consistently (this also applies to the different plated-through holes shown below). Aside from the point-shaped plated-through holes DK, the absorber layer AS is coated with an insulating protective layer OX in order to prevent short-circuits with the contact grid KG that is connected to the emitter layer ES. In another embodiment, the field passivation layer BSF (or analogously the emitter layer ES) can cover the contact grid KG with a continuous surface (left, right). However, if the contact grid KG with its insulation layer IS is thicker than the field passivation layer BSF (or the emitter layer ES), then this layer can also be interrupted in the region of the contact grid KG (middle). Then the result can also be an interruption of the contact layer KS. This interruption, however, is then not a complex structuring, but rather an arrangement that becomes established on its own. All of the reference numerals that are not indicated or explained in the further figures can be found in FIG. 1.

Figure 1B:
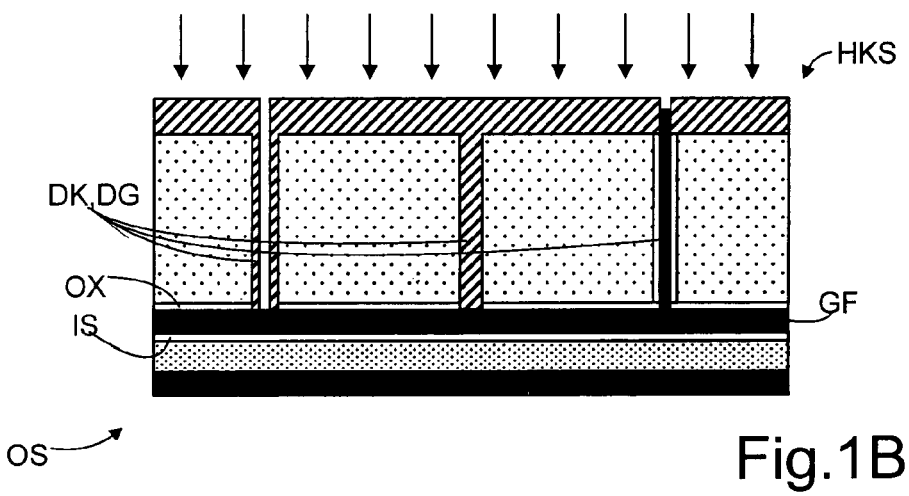
Figures 1C, 1D:
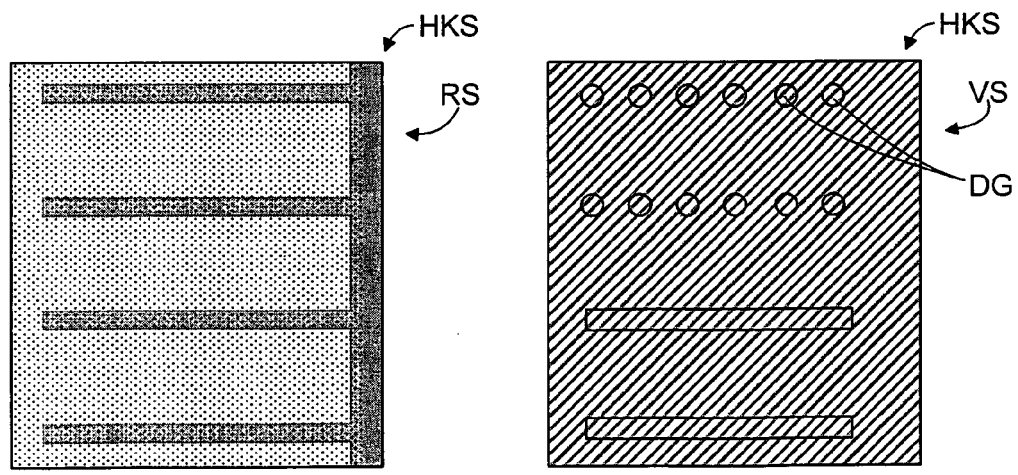

FIG. 1B shows a longitudinal section of the solar cell HKS according to FIG. 1A through a grid finger GF of the contact grid KG having the three different plated-through holes DK. FIG. 1C shows a top view of the solar cell HKS according to FIG. 1A from the back RS (during operation, the side facing away from the light, incident light indicated by parallel arrows), and FIG. 1D shows a top view from the front VS. The passage openings DG are shown in the form of holes (point-shaped, top) and in the form of slits (line-shaped, bottom).

Wafer-Based Solar Cell with Back Contact and Front Field Passivation Layer Plating-Through (FSF-Wrap-Through Concept)

If the emitter layer ES is positioned on the back RS of the absorber layer AS, in an analogous manner, a front field passivation layer (chemically) can also lead through the passage openings DG in the absorber layer AS punctually to the back RS, if it is additionally configured as a front field passivation layer FSF (electronically, e.g. a-Si:H). The newly defined "FSF-wrap-through" concept corresponds to the "metal-wrap-through" concept for back-contact solar cells, whereby instead of a metal, it is the front field passivation layer FSF that is wrapped through. This layer is made of an electrically conductive material, for example, a polymer, a metal or a semiconductor (for example, a-Si:H). As a result, it is possible to minimize ohmic losses of the charge carriers that now—provided that the plated-through field passivation layer FSF conducts better than the absorber layer AS—no longer flow through the absorber layer AS, but rather through the field passivation layer FSF to the contact grid KG. The series resistance and thus the filling factor of a back-contact solar cell HKS with the emitter layer ES located on the back RS can be improved in this manner.

Figure 2A:
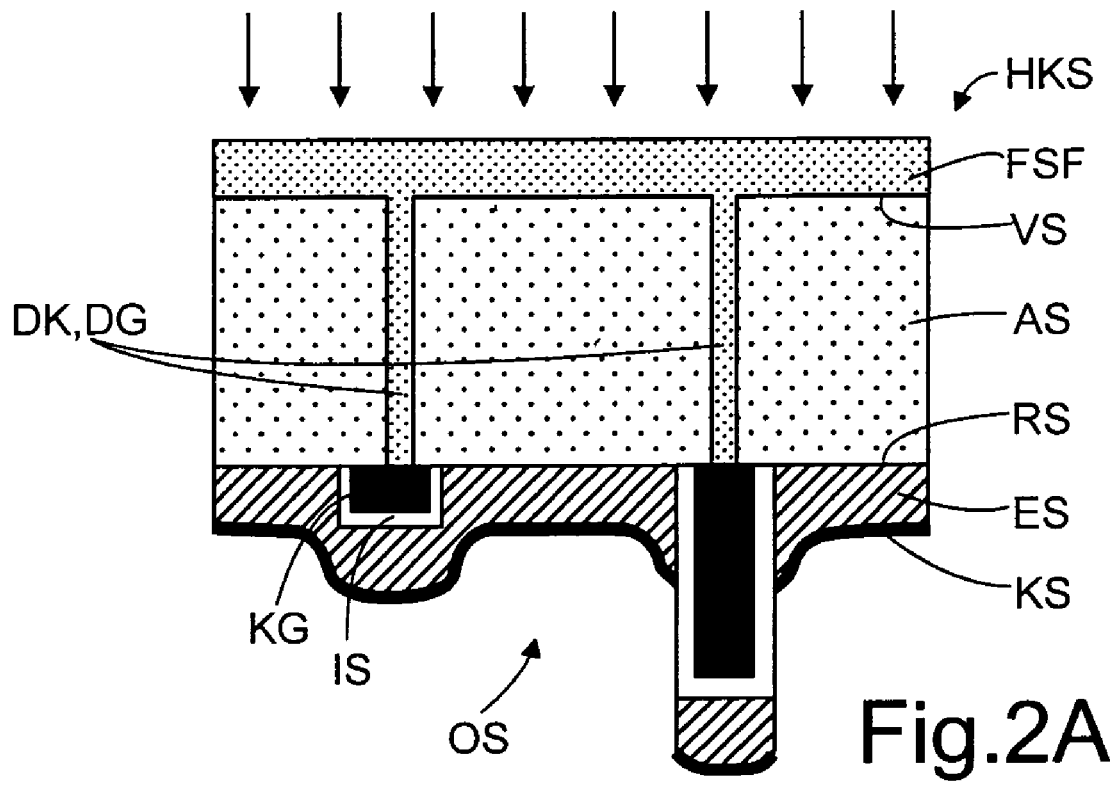
Figure 2B:
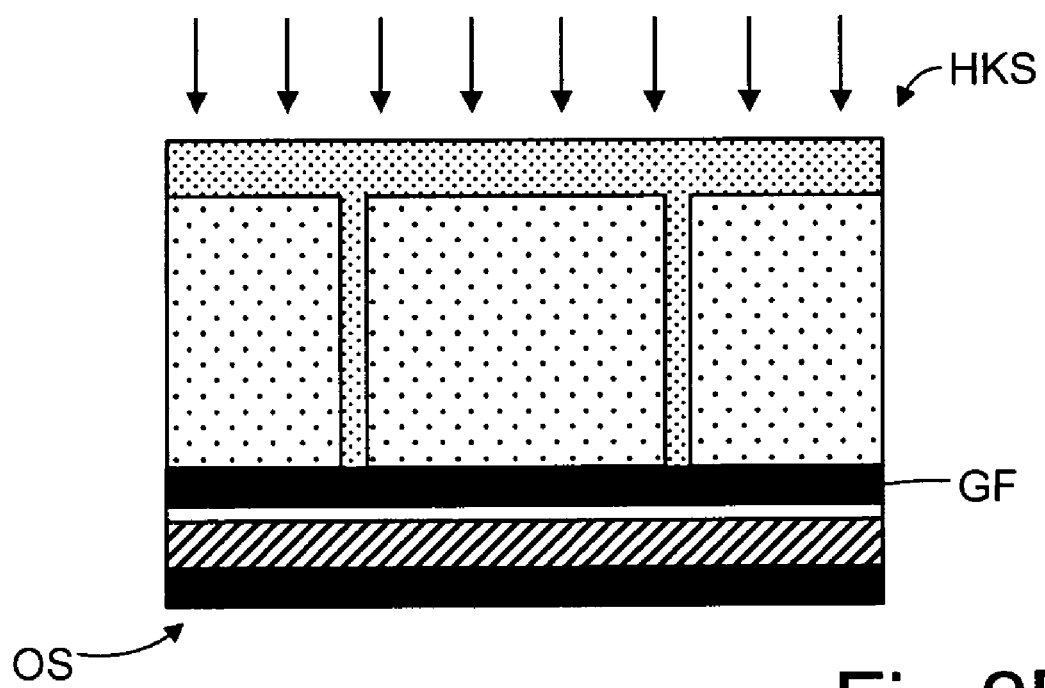

FIG. 2A shows a cross section of a solar cell HKS with a wafer-based absorber layer AS, with a field passivation layer FSF plated-through to the contact grid KG through the absorber layer AS, and with an emitter layer ES located on the back of the absorber layer AS. The plated-through holes DK, in turn, are in the form of filled, coated or diffused passage openings DG. The contact grid KG is electrically conductively connected to the absorber layer AS and additionally to the field passivation layer FSF. FIG. 2B, in turn, shows a longitudinal section through a grid finger GF of the contact grid KG. The absorber layer AS does not have to be insulated with respect to the contact grid KG in the case of a plating-through of a field passivation layer FSF, BSF. The contact grid KG then collects the excess charge carriers from both functional layers.

Figure 3:
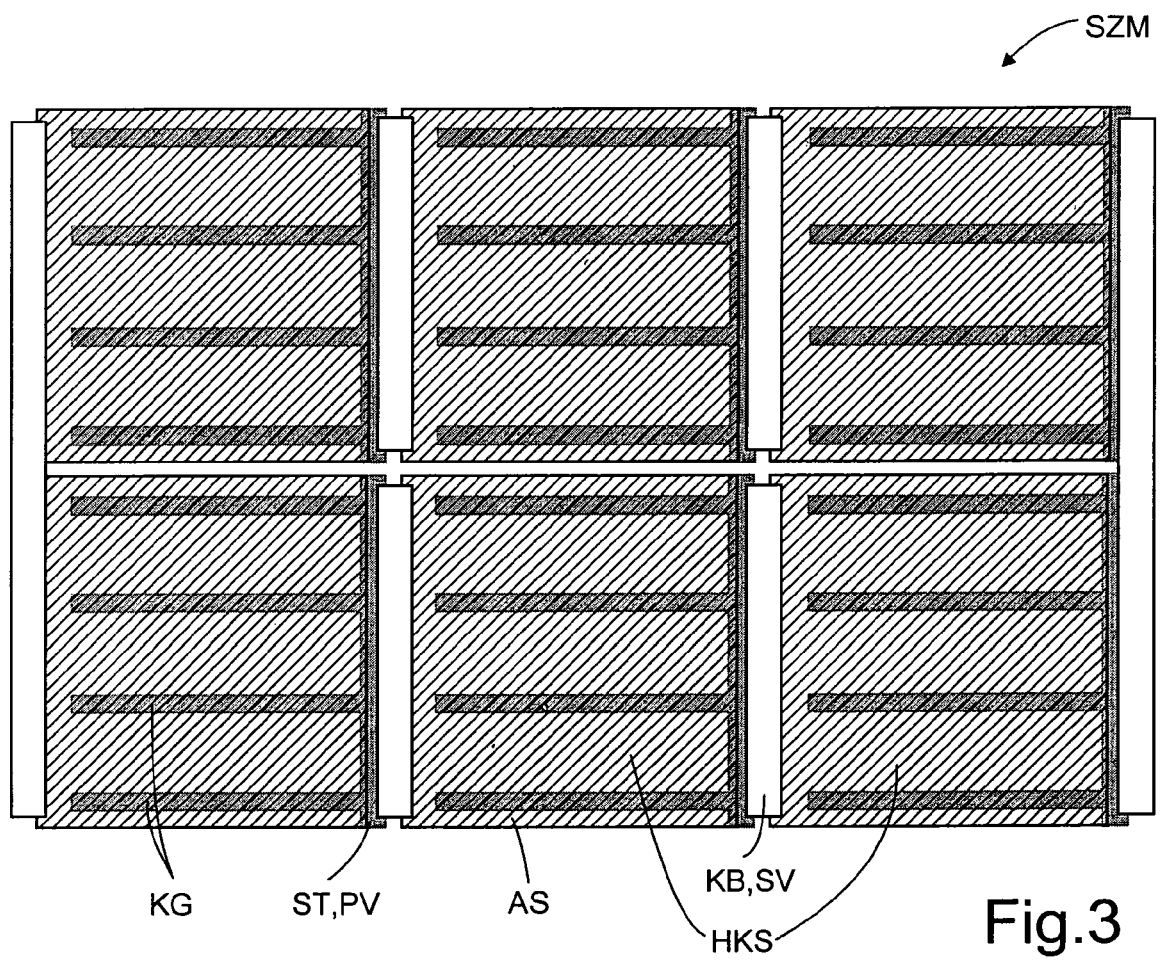
FIG. 3 shows a top view the back of an embodiment of a solar cell module SZM.

Wafer-Based Solar Cell with Back Contact with Series Connection and Parallel Connection FIG. 3 shows a top view of the back of a solar cell module SZM with a series connection SV and a parallel connection PV of solar cell HKS. One can recognize the finger-shaped contact grid KG with the lateral ribs ST and the wafer-based absorber layer AS. The full-surface back-contact layer KS is not shown. The parallel-connected ribs ST are connected in series with each other by means of a copper strip KB.

Thin-Layer-Based Solar Cell with Front Emitter Layer in a Substrate Configuration and Backfield Passivation Layer Plating-Through (BSF-Wrap-Through Concepts I, II)

Figure 4A:
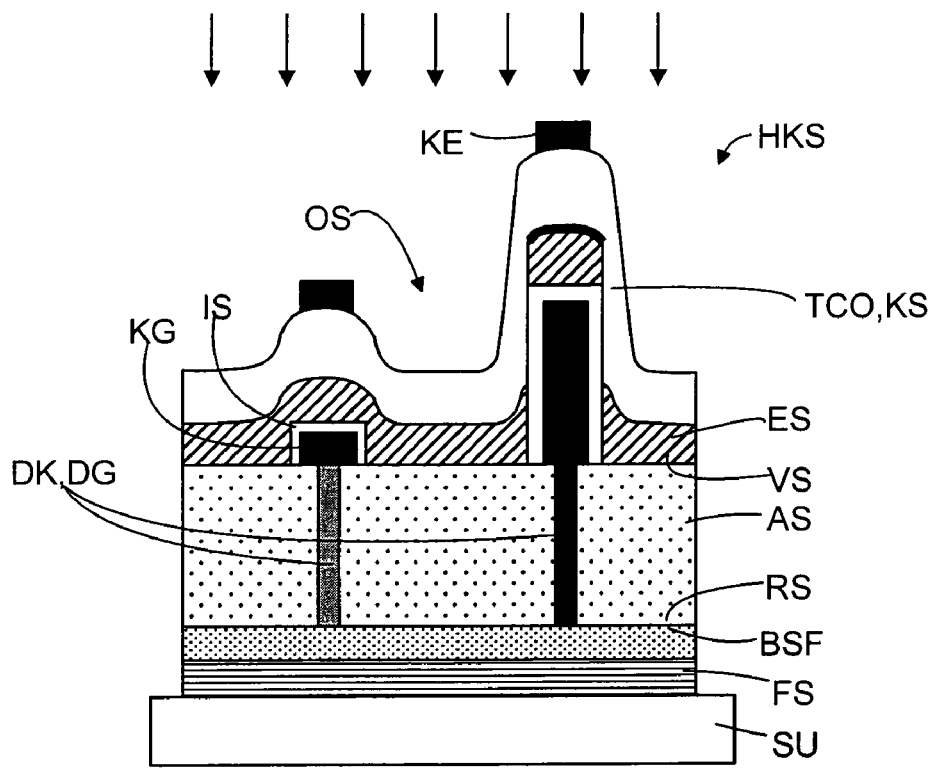
FIGS. 4A and 4B depict cross sectional views of an embodiment of a solar cell HKS in a substrate configuration with a thin absorber layer AS, with an emitter layer ES located on the front of the absorber layer AS facing the light, with a back field passivation layer BSF plated-through through the absorber layer AS to the contact grid KG, with an interposed functional layer FS, and with a substrate SU.

FIG. 4A shows a cross section of a solar cell HKS (here in the version of a hetero-contact solar cell; by appropriately selecting the material of the absorber layer and of the emitter layer, however, a homo-contact solar cell concept can also be created analogously) in a substrate configuration with a thin absorber layer AS, with an emitter layer ES located on the front of the absorber layer AS facing the light, with a back field passivation layer BSF (BSF-wrap-through concept I) plated-through through the absorber layer AS to the contact grid KG, with an interposed functional layer FS, and with a substrate SU. A top OS is defined as the side of the solar cell HKS opposite from the substrate SU. The fingers of the contact grid KG are shown in different heights. The plated-through holes DK are based on passage openings DG filled with a conductive material (polymer, metal, a-Si:H). The full-surface contact layer KS is configured as a transparent conductive oxide layer TCO on which a current-collecting contact element KE is located.

Figure 4B:
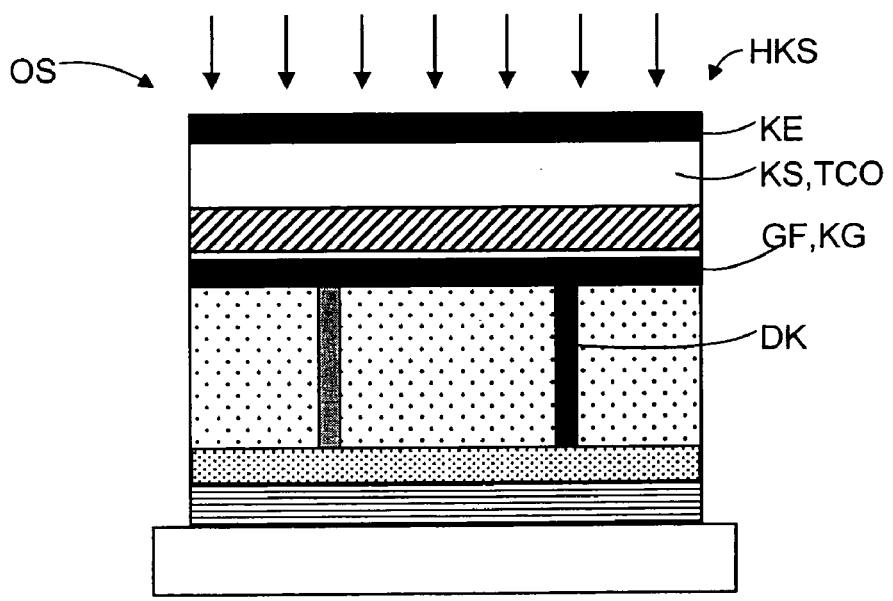
Figure 5A:
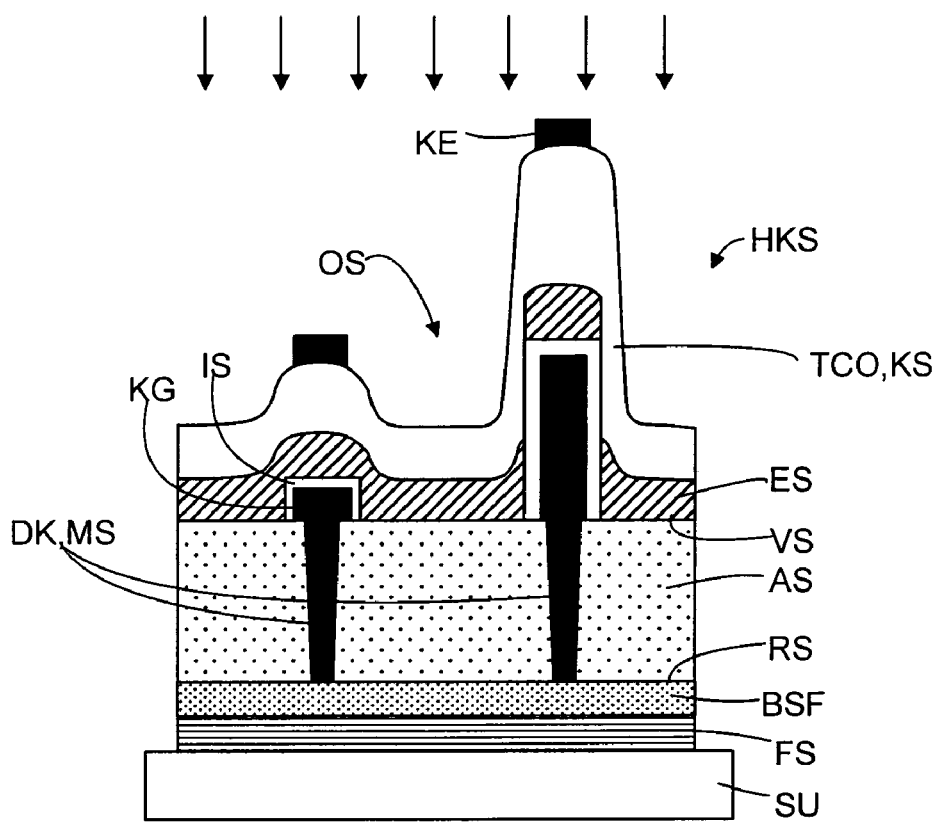
FIGS. 5A and 5B depict cross sectional views of another embodiment of a solar cell HKS.
Figure 5B:
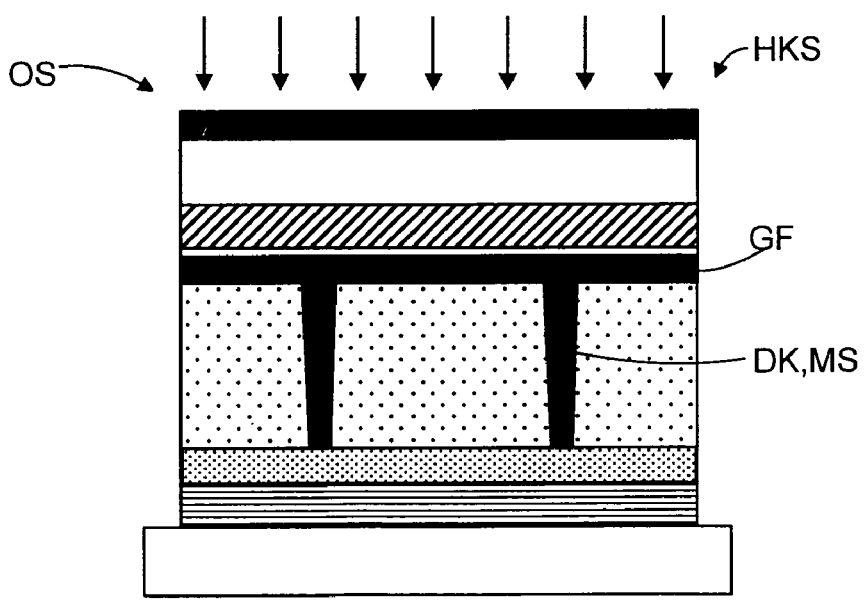

FIG. 4B shows a cross section through a grid finger GF of the contact grid KG with a point-shaped plated-through hole DK. FIGS. 5A, 5B show a set-up that is analogous to that of FIGS. 4A, 4B, except with the difference that here, the plated-through hole DK is based on point-shaped metal spikes MS made of a conductive material such as, for example, aluminum like the contact grid KG (BSF-wrap-through concept II).

Thin-Layer-Based Solar Cell with Front Emitter Layer in a Superstrate Configuration and Emitter Layer Plating-Through (Emitter-Wrap-Through Concepts I, II)

Figure 6A:
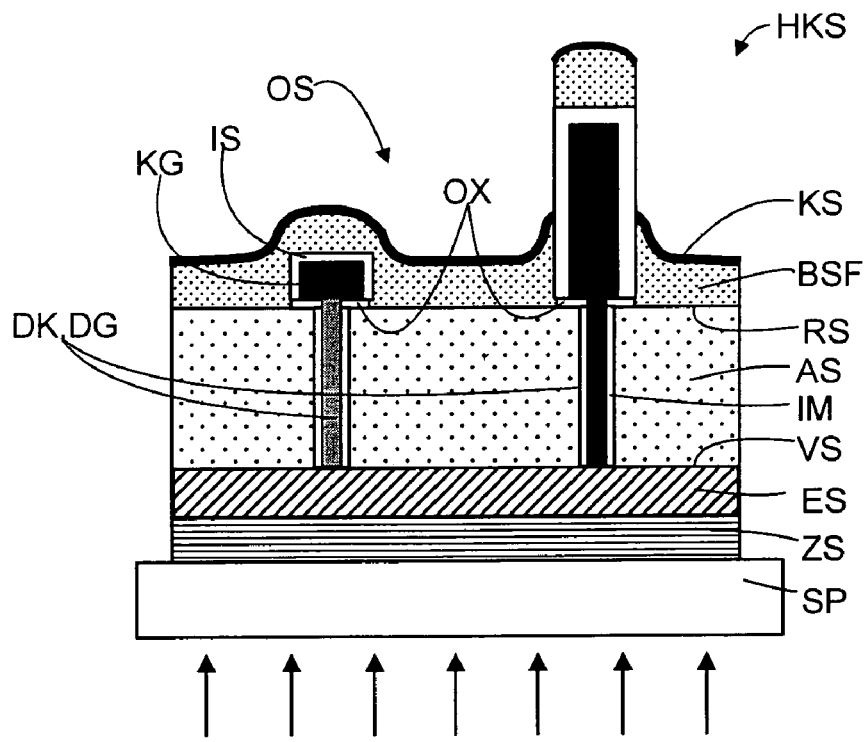
FIGS. 6A and 6B depict sectional views of an embodiment of a thin-layer-based solar cell HKS with a thin absorber layer AS on a superstrate SP and with an emitter layer ES on the front VS of the solar cell HKS facing the light during operation.
Figure 6B:
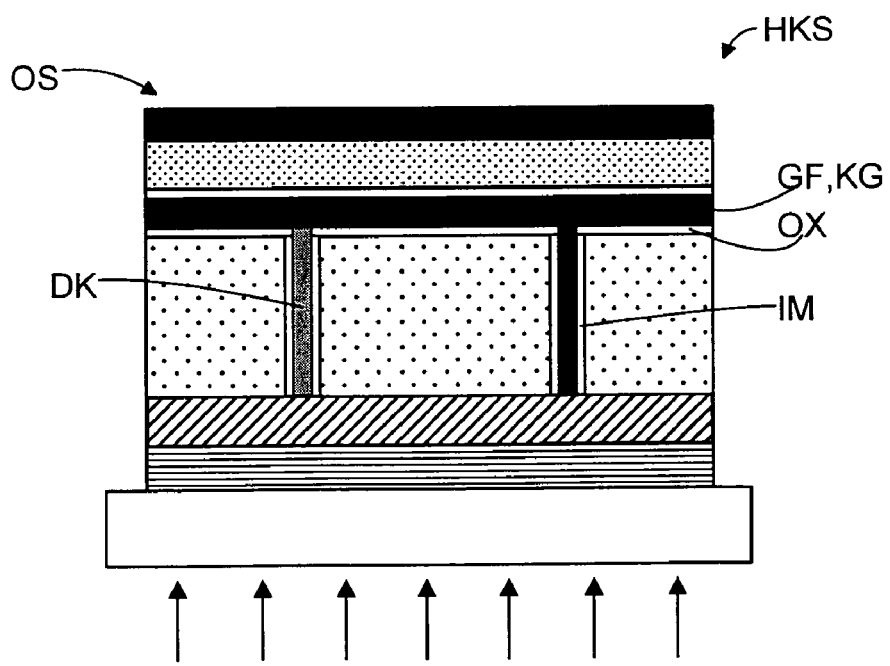

FIG. 6A shows a cross section through a thin-layer-based solar cell HKS with a thin absorber layer AS on a superstrate SP and with an emitter layer ES on the front VS of the solar cell HKS facing the light during operation. The cross section runs through two contact fingers KF of the contact grid KG with different heights. In one embodiment, only one possibility is carried out consistently (this also applies to the different plated-through holes shown below). The emitter layer ES is connected to the contact grid KG by means of point-shaped plated-through holes DK (electrically conductive polymer on the left, metal on the right) (emitter-wrap-through concept I). The absorber layer AS is electrically insulated with respect to the contact grid KG by means of an insulating protective layer OX. One or more intermediate layers ZS are provided between the thin emitter layer ES and the superstrate SP. FIG. 6B shows a longitudinal section through a grid finger GF of the contact grid KG.

Figure 7A:
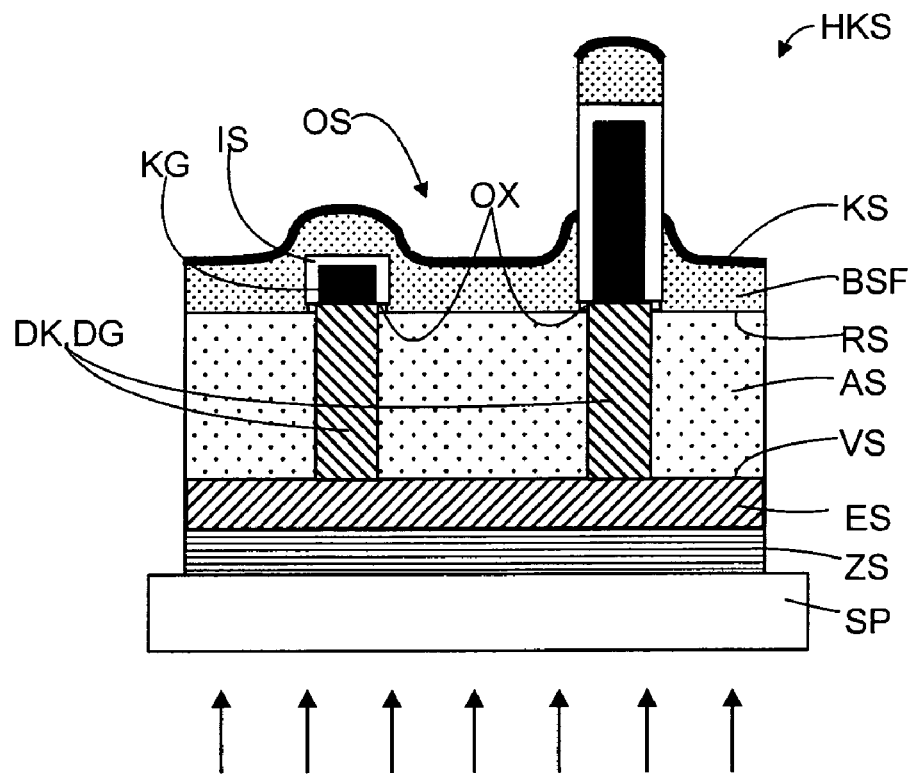
FIGS. 7A and 7B depict sectional views of another embodiment of a thin-layer-based solar cell HKS.
Figure 7B:
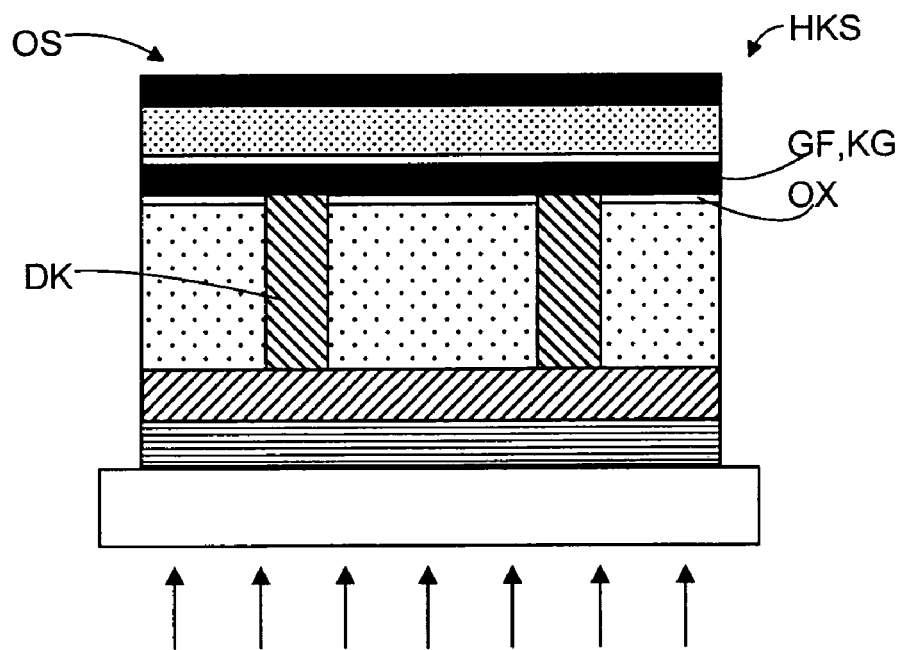

FIGS. 7A and 7B are set up analogously to FIGS. 6A and 6B. They show another emitter-wrap-through concept II with wide plated-through holes DK. Here, the insulating protective layer OX on the absorber layer AS can be eliminated if line-shaped plated-through holes DK are provided, since then the width of the plated-through holes DK along the entire length of the grid fingers GF already prevents a short circuit of the absorber layer AS having the contact grid KG.

Thin-Layer-Based Solar Cell with Back Emitter Layer in a Substrate Configuration and Emitter Layer Plating-Through (Emitter-Wrap-Through Concepts I, II)

Figure 8A:
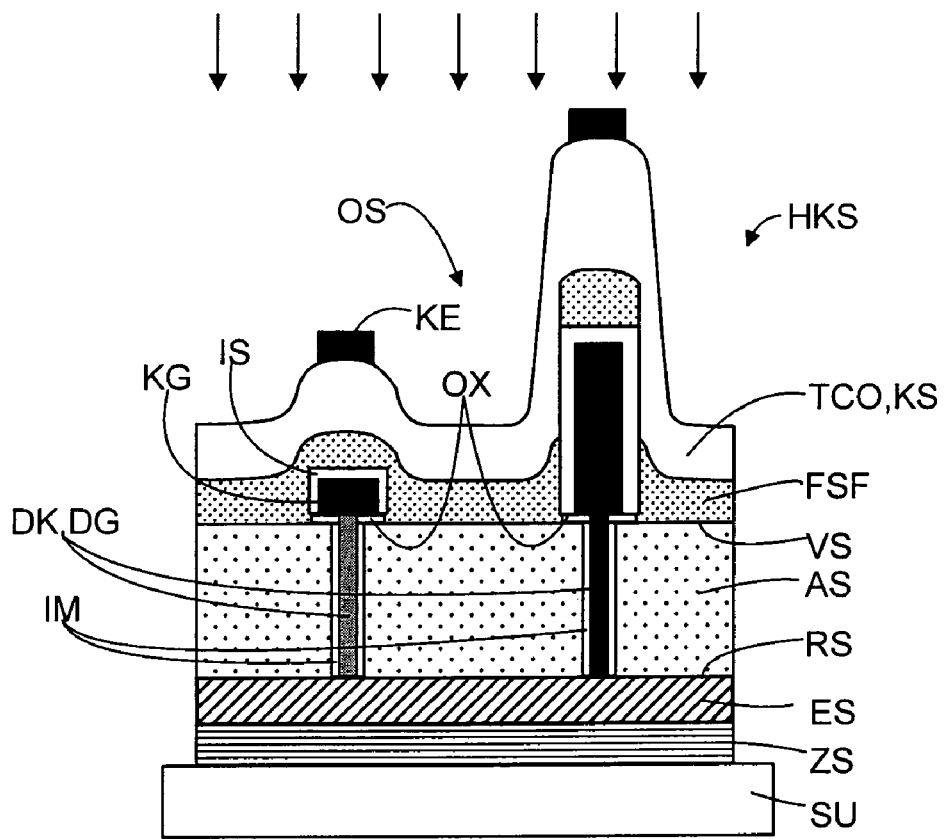
FIGS. 8A and 8B show sectional views of an embodiment of a solar cell HKS through grid fingers GF having different heights.
Figure 8B:
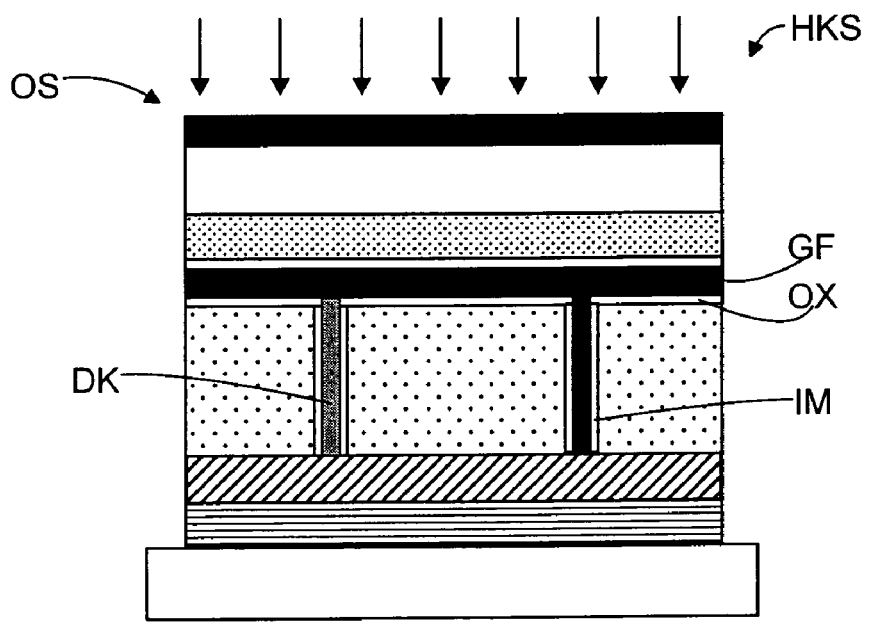

Analogously to the preceding figures with an emitter layer ES on the front VS of the solar cell HKS facing the light during operation, the following figures show a constellation of the emitter layer ES on the back RS of the solar cell HKS facing away from the light during operation. The two contact systems are located on the front VS of the solar cell HKS. The contact layer KS is configured so as to be transparent and also has current-collecting contact elements KE, which are arranged congruently to the contact grid KG in order to minimize the shading losses. FIG. 8A shows a cross section through two grid fingers GF having different heights. When the emitter layer ES is plated-through, the absorber layer AS applied to a substrate SU, in turn, has an insulating protective layer OX in order to prevent short circuits to the contact grid KG. Two different point-shaped plated-through holes DK are shown. Both are first lined with an insulating material IM. The left-hand plated-through hole DK is filled with a conductive polymer, while the right-hand one is filled with a metal. FIG. 8B shows a corresponding longitudinal section through a grid finger GF. The two different point-shaped plated-through holes DK and the insulating protective layer OX on the absorber layer AS can be seen.

Figure 9A:
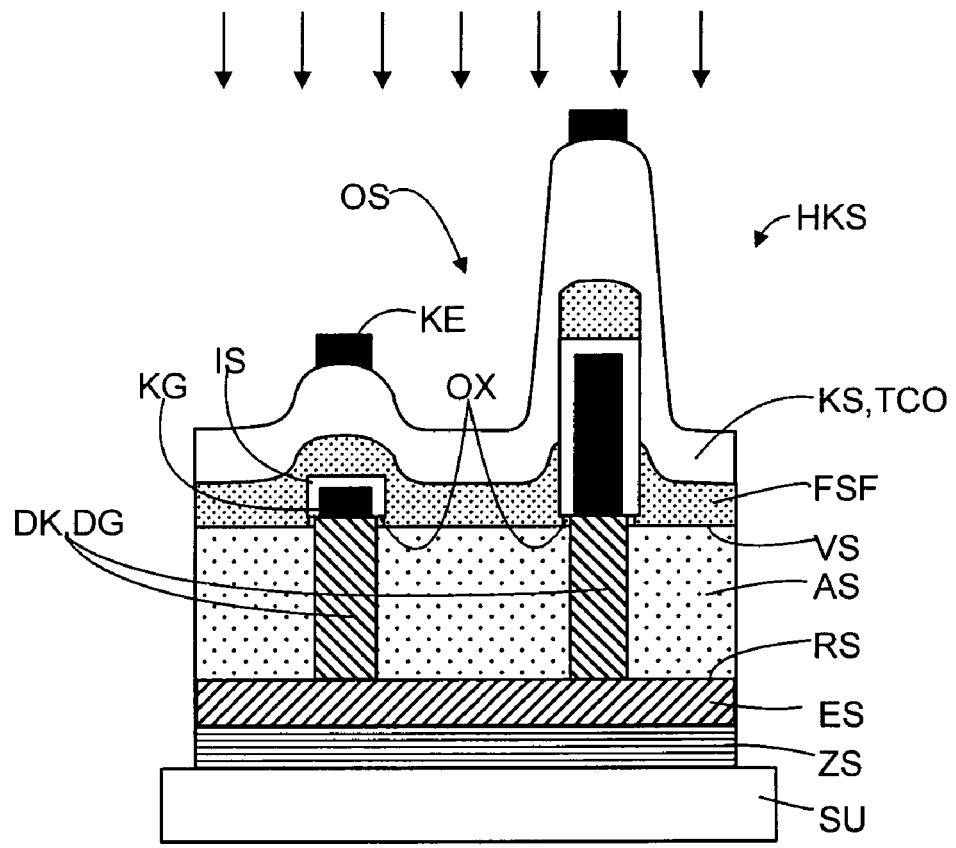
FIGS. 9A and 9B show sectional views of another embodiment of a solar cell HKS.
Figure 9B:
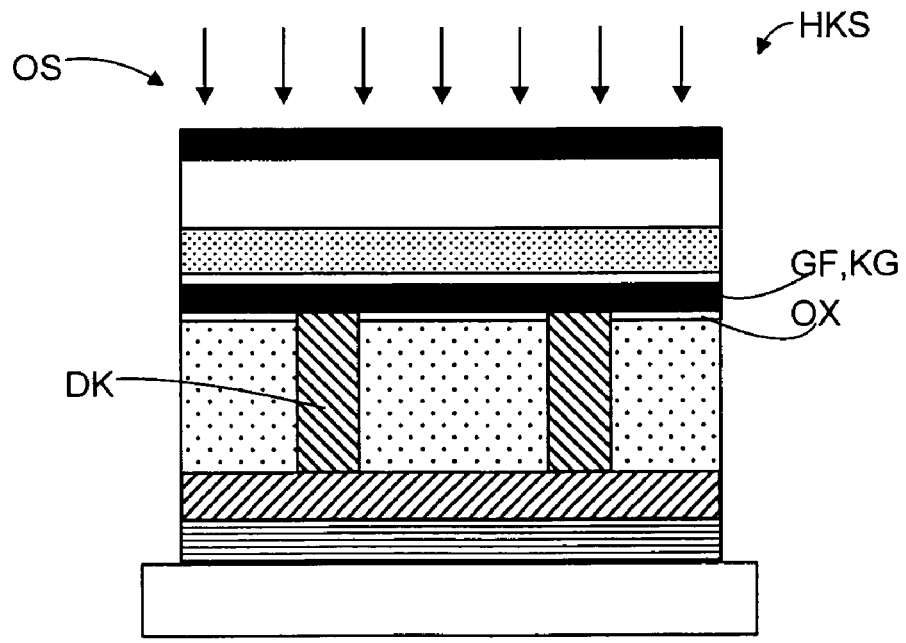

FIGS. 9A and 9B are set up analogously to FIGS. 8A and 8B. They show another emitter-wrap-through concept II with wide plated-through holes DK. Here, the insulating protective layer OX on the absorber layer AS can be eliminated if line-shaped plated-through holes DK are provided, since then the width of the plated-through holes DK along the entire length of the grid fingers GF already prevents a short circuit of the absorber layer AS having the contact grid KG.

Thin-Layer-Based Solar Cell with Back Emitter Layer in a Superstrate Configuration and Front Field Passivation Layer Plating-Through (FSF-Wrap-Through Concepts I, II)

Figure 10A:
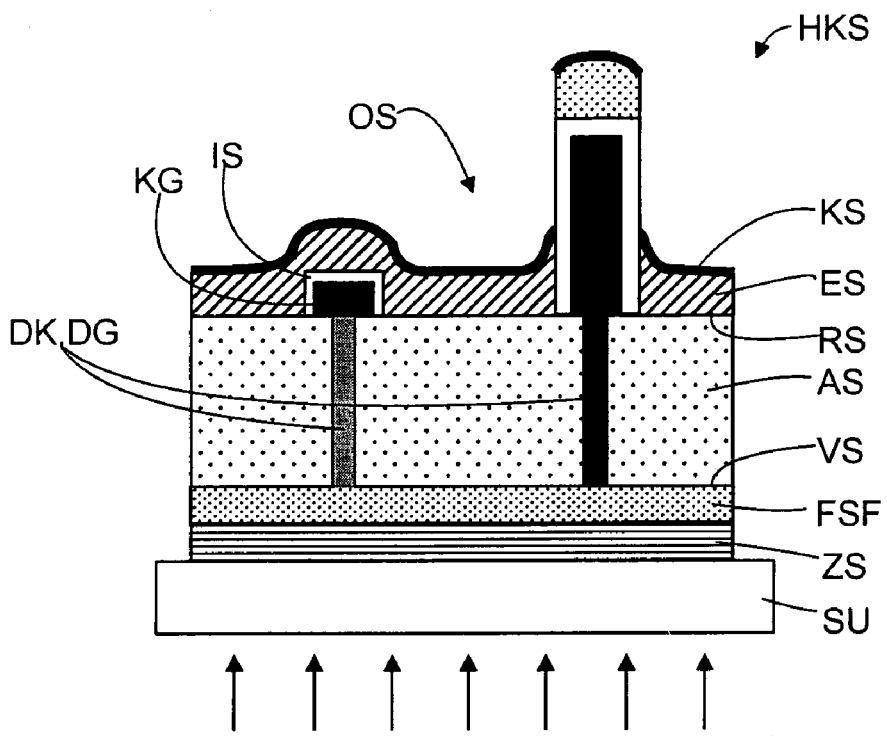
FIGS. 10A and 10B depict sectional views of an embodiment of a solar cell HKS through contact fingers KF having different heights.
Figure 10B:
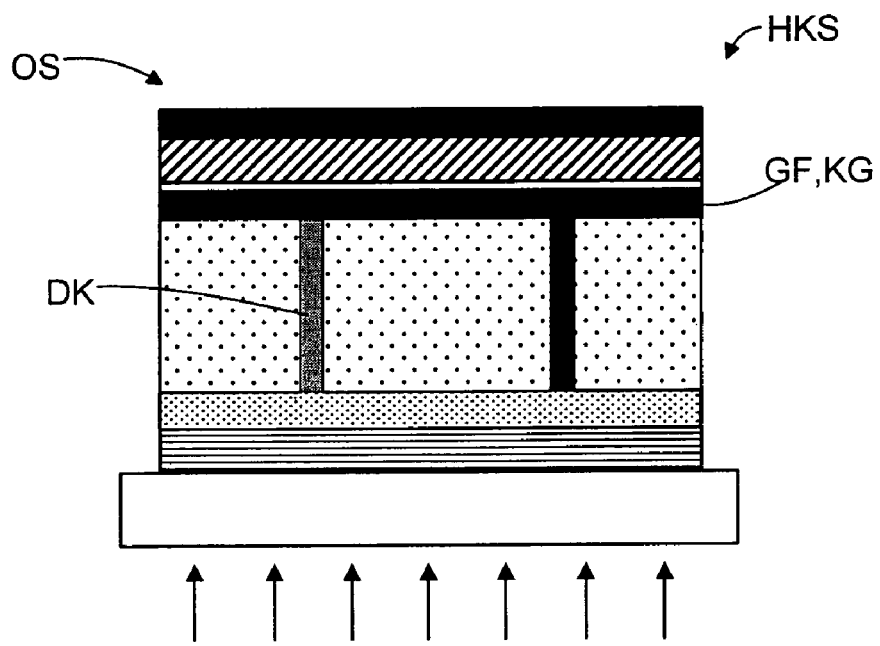
Figure 11A:
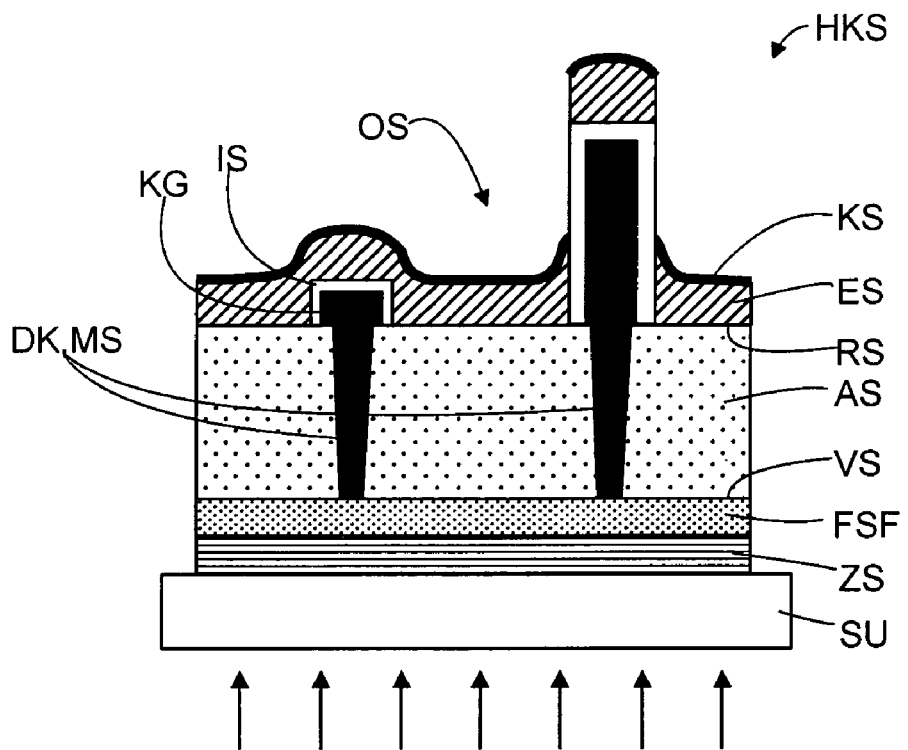
FIGS. 11A and 11B depict sectional views of another embodiment of a solar cell HKS.
Figure 11B:
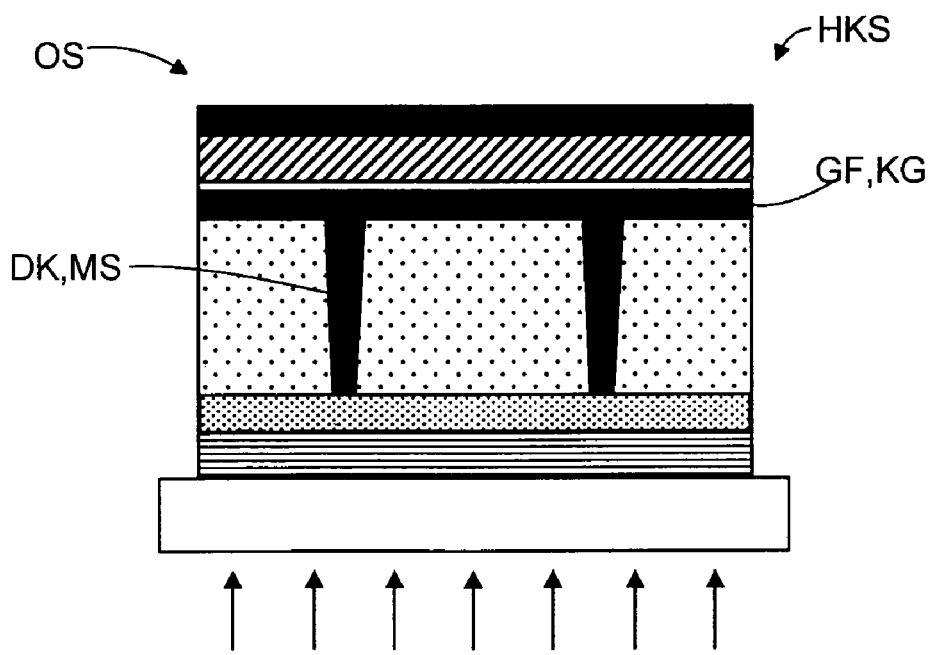

FIGS. 10A and 10B show a solar cell HKS with a substrate SU. The contact systems are correspondingly arranged on the back RS of the solar cell HKS. The contact layer KS is not configured so as to be transparent. The top OS is defined as the side of the solar cell HKS opposite from the superstrate SP. FIG. 10A shows a cross section through two contact fingers KF with different heights. The front field passivation layer FSF is connected to the contact grid KG by means of plated-through holes DK (FSF-wrap-through concept I). Once again, two different plated-through holes DK are shown (filled with functional material of the front field passivation layer FSF on the left, and filled with metal on the right). FIG. 10B shows a longitudinal section through a grid finger GF. FIGS. 11A and 11B show an analogous set-up with an FSF-wrap-through concept II. Here, the plated-through holes DK are formed by metal spikes MS.

Thin-Layer-Based Solar Cell with Front Contact with a Series Connection or a Parallel Connection The thin-layer-based solar cell structure according to the invention allows a simple series connection and parallel connection of the individual solar cells HKS with only two structuring steps, whereby all of the solar cell layers can still be deposited over the entire surface.

Figure 12A:
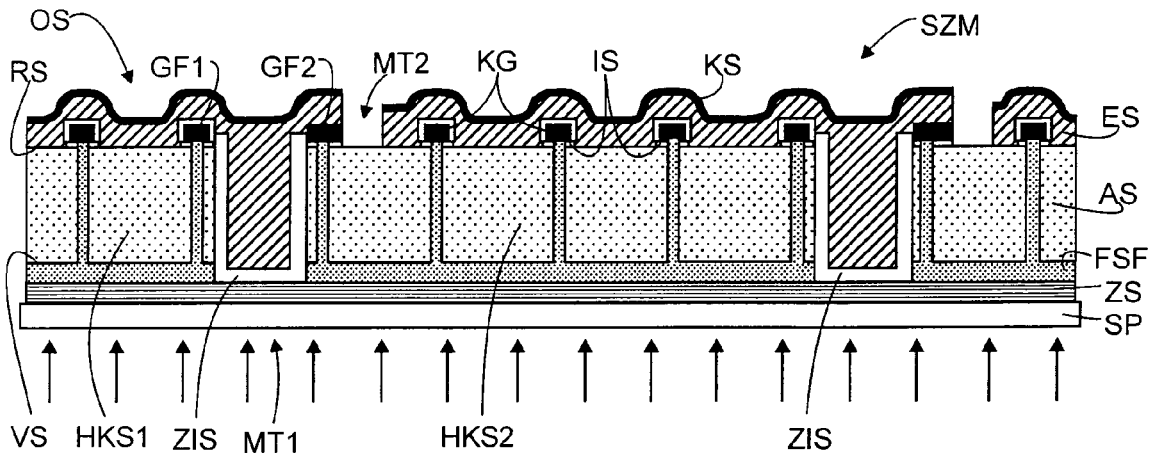
FIGS. 12A and 12B show cross sectional and top views through a series connection of an embodiment of a solar cell module SZM.
Figure 12B:
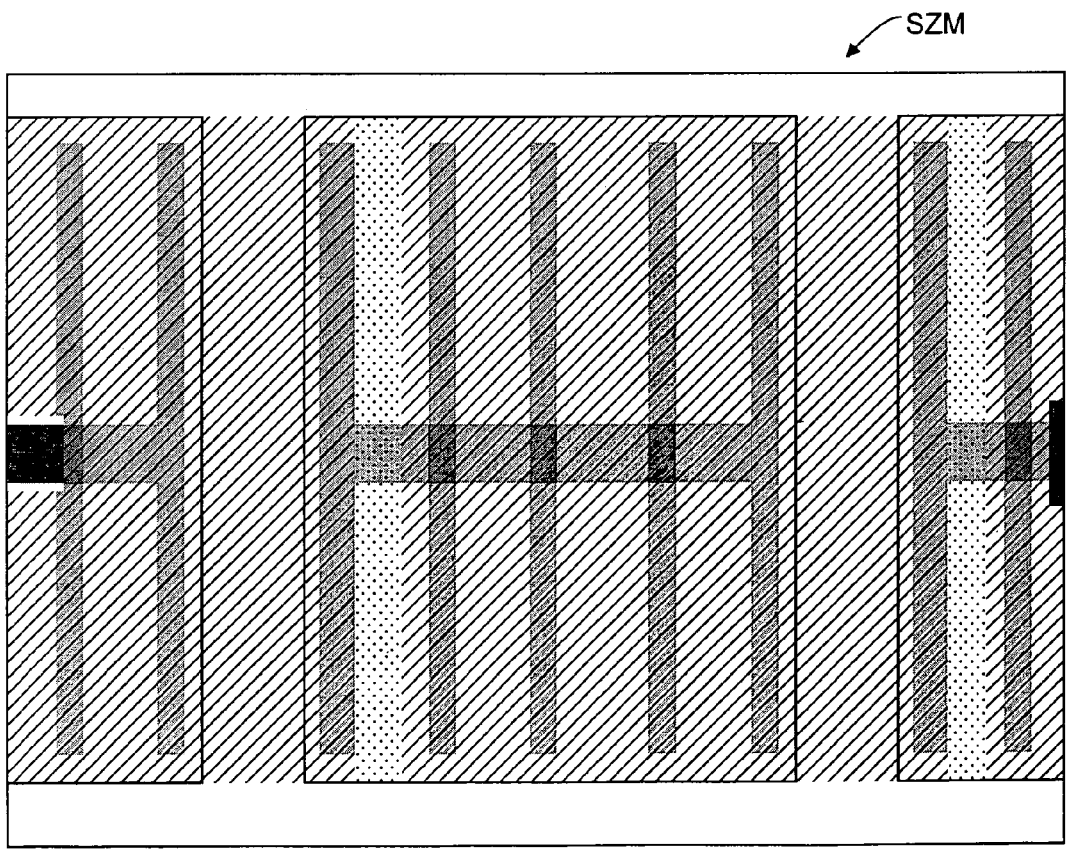
Figure 13A:
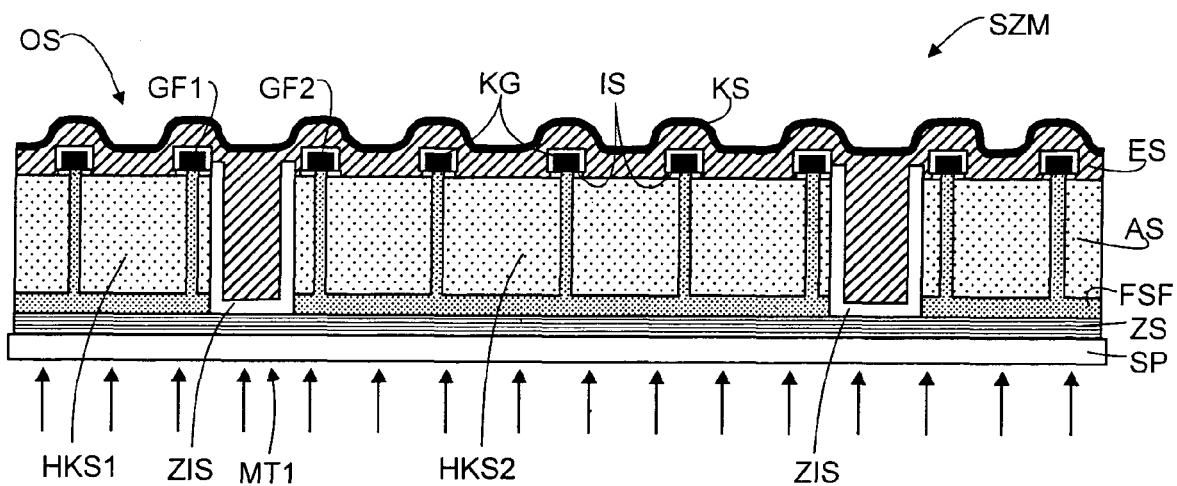
FIGS. 13A and 13B show cross sectional and top views through a parallel connection of a solar cell module SZM.
Figure 13B:
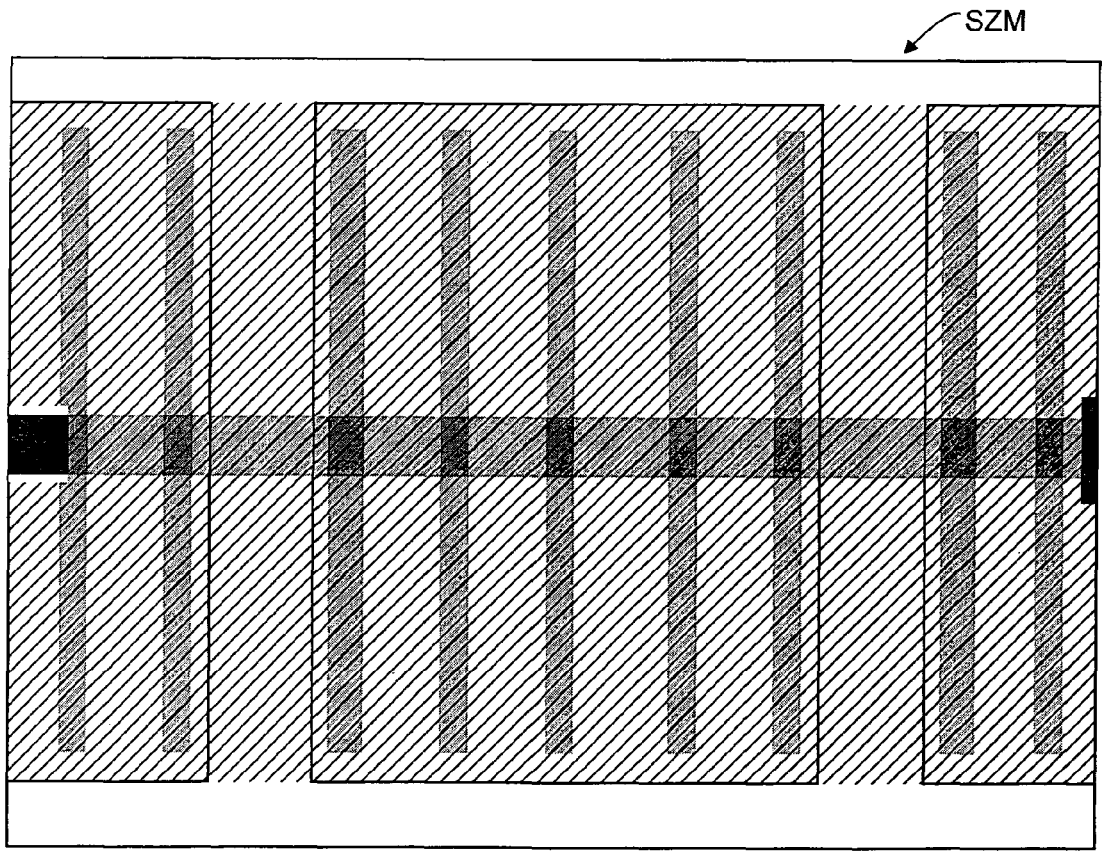

FIG. 12A shows a cross section through a series connection of a back-contact solar cell module SZM in a superstrate configuration with a front, plated-through emitter layer ES and a back field passivation layer BSF. FIG. 12B shows a top view of the back of the solar cell module SZM, omitting the contact layer KS. FIGS. 13A and 13B analogously show a cross section and a top view through a parallel connection of the solar cell module SZM. The contact grid KG is then contacted in each case on the right-hand side of the solar cell module SZM, and the contact layer KS is contacted on the right-hand side.

Immediately after the application of the contact grid KG on the front VS of the absorber layer AS or after the application of the electric insulating layer IS onto the contact grid KG, a first module structuring step MT1 is carried out in the individual solar cells HKS1, HKS2 (e.g. creation of narrow strips by means of mechanical scratching or laser scribing). This structuring separates at least the thin absorber layer AS and the first functional solar cell layer (here BSF). However, it can also extend all the way down to the substrate SU or superstrate SP (separation of the optional intermediate layers ZS). For example, in each case, two adjacent grid fingers GF1, GF2 that belong to the different solar cells HKS1, HKS2 can be configured in such a way that the interstice between them is removed by laser structuring. Moreover, the created interstice may be sheathed with an intermediate insulation layer ZIS (e.g. by an oxide formed by means of the laser structuring).

In the case of a series connection (FIGS. 12A, 12B), the contact layer KS of the solar cell HKS1 are contacted with the grid finger GF2 of the solar cell HKS2. In the case of a parallel connection, the contact layers KS and the contact grid KG of the individual solar cells HKS1, HKS2 are contacted (namely, the contact layer KS of the solar cell HKS1 with the contact layer KS of the solar cell HKS2, and the grid finger GF1 of the solar cell HKS1 with the grid finger GF2 of the solar cell HKS2). This means that, in the case of a series connection, for example, the grid finger GF1 is electrically insulated, but that the grid finger GF2 is not electrically insulated. This can be achieved most simply, for example, with the electric insulation of the contact grid KG if the insulation layer IS is applied by means of screen printing. As an alternative, for instance, a subsequent punctiform burning with a laser is also conceivable, which destroys any insulation layer IS that was originally present. In the case of a parallel connection, both grid fingers GF1, GF2 remain insulated and the connection of the grid fingers GF1, GF2 is made directly by means of the rib ST (busbar) of the contact grid KG. The desired series connection or parallel connection is then automatically established by the full-surface deposition of the second functional solar cell layer (here, the back field passivation layer BSF) and the contact layer KS. In the case of the series connection, after the full-surface application of the contact layer KS, a second module structuring step MT2 is carried out, which separates the second functional solar cell layer (here, the back field passivation layer BSF) of the solar cell HKS1 from the solar cell HKS2.

As an alternative, the solar cells HKS can also be produced only after the application of the contact layer KS (first module structuring step MT1). The connection methods are then used that were already described for the back-contact, wafer-based solar cells HKS. As a result, the second module structuring step MT2 is eliminated, but the series connection or parallel connection still has to be made subsequently.

LIST OF REFERENCE NUMERALS

AS absorber layer
BSF back field passivation layer
DG passage opening
DK plated-through hole
ES emitter layer
FS functional layer
FSF front field passivation layer
GF grid finger
HKS solar cell (hetero-contact solar cell embodiment)
IM insulating material
IS electrically non-conductive insulation layer
KB copper strip
KE contact element
KG contact grid
KS contact layer
MS metal spike
MT module structuring step
OS top (accessible side) of HKS
OX electrically insulating protective layer
PV parallel connection
RS back (side not provided for the incident light) of AS
SP superstrate
ST rib
SU substrate
SV series connection
SZM solar cell module
TCO transparent conductive oxide layer
VS front (side provided for the incident light) of AS
ZIS intermediate insulation layer
ZS intermediate layer

The invention claimed is:

1. A single-sided contact solar cell comprising:
 (a) an absorber layer including plated-through holes, each having a first end and a second end, one of the first and second ends of the plated-through holes being associated with a first side of the absorber layer while another one of the first and second ends of the plated-through holes is associated with a second side of the absorber layer,
 (b) an emitter layer disposed on the first side of the absorber layer, the emitter layer including one or more semiconductor materials having different dopants,
 (c) a field passivation layer disposed on the second side of the absorber layer;
 (d) a contact grid covered on a top surface thereof with an insulation layer and electrically connected to the first end of the plated-through holes; and
 (e) a contact layer, wherein:
  (i) the contact grid and contact layer are disposed together on one side of the absorber layer and insulated with respect to each other and electrically contacted from outside of the solar cell;

(ii) the contact grid is disposed between the absorber layer and the emitter layer or the field passivation layer, and the contact layer is disposed on the emitter layer or on the field passivation layer so that both the contact grid and contact layer are disposed on a top surface of the solar cell;

(iii) the emitter layer or the field passivation layer is electrically connected to the second end of the plated-through holes; and (iv) where the second end of the plated-through holes is electrically connected to the emitter layer, the absorber layer and the contact grid are electrically insulated from each other.

2. The single-sided contact solar cell according to claim 1, wherein the absorber layer is a self-supporting wafer or a thin layer on a substrate or superstrate.

3. The single-sided contact solar cell according to claim 2, wherein the absorber layer is the thin layer, the solar cell further comprising additional functional layers disposed between the thin layer and a supporting substrate or superstrate.

4. The single-sided contact solar cell according to claim 1, wherein the plated-through holes are electrically conductive passage openings having a hole-shaped or slit-shaped or grid-shaped or lattice-shaped form, and are filled with a semiconductor material having a same functionality as the emitter layer or the field passivation layer.

5. The single-sided contact solar cell according to claim 1, wherein the plated-through holes are electrically conductive passage openings having a hole-shaped or slit-shaped or grid-shaped or lattice-shaped form, are filled with an electrically conductive material, and where the second end of the plated-through holes is electrically connected to the emitter layer, are at least partially lined with an electrically insulating material.

6. The single-sided contact solar cell according to claim 1, wherein the plated-through holes are metal spikes having a hole-shaped or slit-shaped or grid-shaped or lattice-shaped form.

7. The single-sided contact solar cell according to claim 1, further comprising additional functional layers disposed on the top surface of the solar cell.

8. The single-sided contact solar cell according to claim 1, further comprising buffer layers disposed between the absorber layer and at least one of the emitter layer and the field passivation layer.

9. The single-sided contact solar cell according to claim 1, wherein the contact grid comprises a grid surface optimized in terms of shading and charge carrier collection, the contact grid disposed on a front of the absorber layer.

10. The single-sided contact solar cell according to claim 9, further comprising a grid-shaped contact element electrically connected to a transparent form of the contact layer and arranged on the transparent form of the contact layer congruently to the contact grid.

11. The single-sided contact solar cell according to claim 10, wherein the absorber layer comprises a mono-crystalline, multi-crystalline or poly-crystalline or recrystallized silicon; one or more of the field passivation layer, the emitter layer, and the functional layers comprise amorphous, hydrogenated silicon or multi-crystalline or poly-crystalline silicon; the contact grid comprises aluminum; the contact layer comprises aluminum or a transparent conductive oxide; the contact element comprises chromium or silver; and the conductive material for filling up passage openings comprises a metal, a semiconductor material, or a polymer.

12. The single-sided contact solar cell according to claim 1, further comprising a rib on an edge of the solar cell for electrically contacting the contact grid from the outside.

13. The single-sided contact solar cell according to claim 12, wherein the rib is comb-like for the electric series connection or parallel connection of several solar cells in a solar cell module.

14. The single-sided contact solar cell according to claim 1, further comprising an opening in the emitter layer and in the insulation layer for electrically contacting the contact grid from the outside.

15. The single-sided contact solar cell according to claim 1, wherein the emitter layer comprises a semiconductor material that establishes a passivating p-n junction to the absorber layer and has a maximum boundary surface recombination rate of the charge carriers of $10^5$ recombinations per $cm^2 s$.

16. The single-sided contact solar cell according to claim 1, wherein the insulation layer has a thickness that prevents tunneling-through.

* * * * *